(12) United States Patent
Kurjanowicz

(10) Patent No.: US 8,933,492 B2
(45) Date of Patent: Jan. 13, 2015

(54) LOW VT ANTIFUSE DEVICE

(75) Inventor: Wlodek Kurjanowicz, Ottawa (CA)

(73) Assignee: Sidense Corp., Ottawa, Ontario (CA)

( * ) Notice: Subject to any disclaimer, the term of this patent is extended or adjusted under 35 U.S.C. 154(b) by 423 days.

(21) Appl. No.: 12/266,828

(22) Filed: Nov. 7, 2008

(65) Prior Publication Data

US 2009/0250726 A1  Oct. 8, 2009

Related U.S. Application Data

(60) Provisional application No. 61/042,511, filed on Apr. 4, 2008.

(51) Int. Cl.
  *H01L 23/52* (2006.01)
  *H01L 27/10* (2006.01)
  *H01L 23/525* (2006.01)
  *H01L 27/02* (2006.01)

(52) U.S. Cl.
  CPC .......... *H01L 27/101* (2013.01); *H01L 23/5252* (2013.01); *H01L 27/0207* (2013.01)
  USPC .................................. 257/209; 257/E29.226

(58) Field of Classification Search
  USPC .......................................... 257/209, E29.226
  See application file for complete search history.

(56) References Cited

U.S. PATENT DOCUMENTS

| | | | |
|---|---|---|---|
| 6,667,902 B2 | 12/2003 | Peng | |
| 6,671,040 B2 | 12/2003 | Fong et al. | |
| 7,402,855 B2 | 7/2008 | Kurjanowicz | |
| 2006/0030107 A1 * | 2/2006 | Huang et al. | .................. 438/275 |
| 2006/0292754 A1 | 12/2006 | Min et al. | |
| 2007/0076463 A1 | 4/2007 | Keshavarzi et al. | |
| 2007/0257331 A1 | 11/2007 | Kurjanowicz et al. | |

FOREIGN PATENT DOCUMENTS

| | | |
|---|---|---|
| JP | 04-323867 | 11/1992 |
| JP | 2001-196470 A | 7/2001 |
| JP | 2007-536744 A | 12/2007 |

OTHER PUBLICATIONS

Canadian Patent Application No. 2,646,367, Office Action dated Apr. 16, 2009.

(Continued)

*Primary Examiner* — Matthew Reames
(74) *Attorney, Agent, or Firm* — Shin Hung; Borden Ladner Gervais LLP

(57) ABSTRACT

A one time programmable memory cell having an anti-fuse device with a low threshold voltage independent of core circuit process manufacturing technology is presented. A two transistor memory cell having a pass transistor and an anti-fuse device, or a single transistor memory cell having a dual thickness gate oxide, are formed in a high voltage well that is formed for high voltage transistors. The threshold voltage of the anti-fuse device differs from the threshold voltages of any transistor in the core circuits of the memory device, but has a gate oxide thickness that is the same as a transistor in the core circuits. The pass transistor has a threshold voltage that differs from the threshold voltages of any transistor in the core circuits, and has a gate oxide thickness that differs from any transistor in the core circuits. The threshold voltage of the anti-fuse device is lowered by omitting some or all of the threshold adjustment implants that is used for high voltage transistors fabricated in the I/O circuits.

30 Claims, 15 Drawing Sheets

(56) References Cited

OTHER PUBLICATIONS

International Application No. PCT/CA2009/000429: search report dated Jul. 7, 2009.
Kujanowicz et al., U.S. Appl. No. 11/732,552, filed Jun. 13, 2007.
English Translation of Japanese Patent Application No. 2011-502202 Office Action dated Sep. 25, 2013.
English Translation of Japanese Patent Application No. 2011-502202 Office Action dated Mar. 20, 2014.
English Translation of Chinese Patent Application No. 200980121131.2 Office Action dated Jun. 9, 2014.
English Translation of Taiwan Patent Application No. 97143418 Office Action dated Oct. 20, 2014.

* cited by examiner

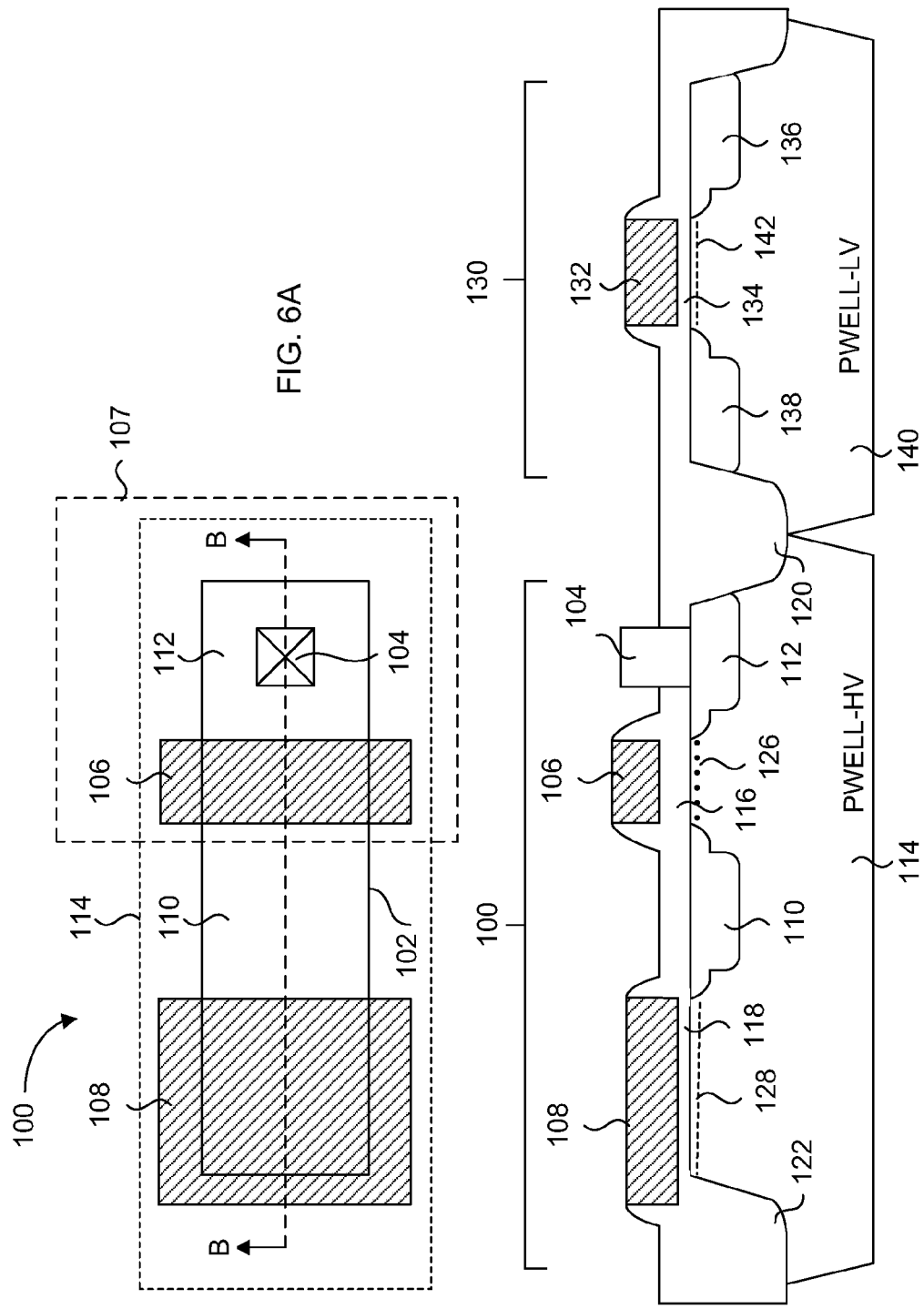

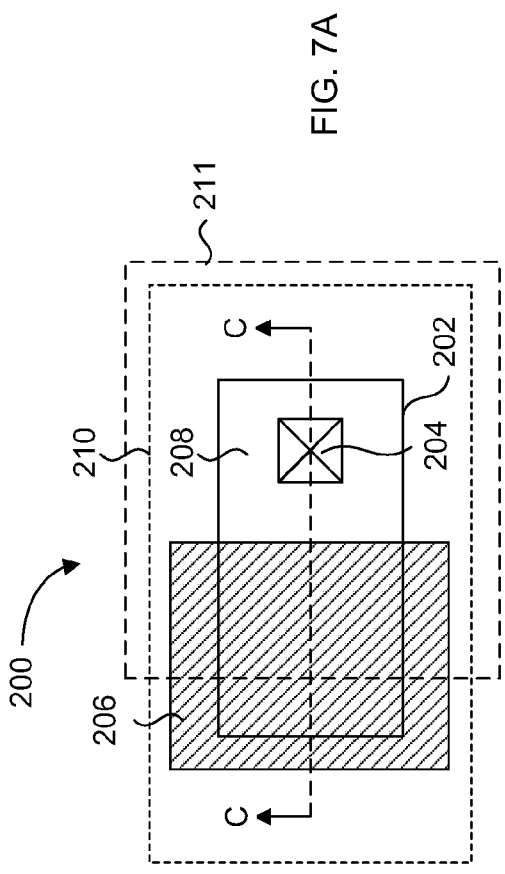
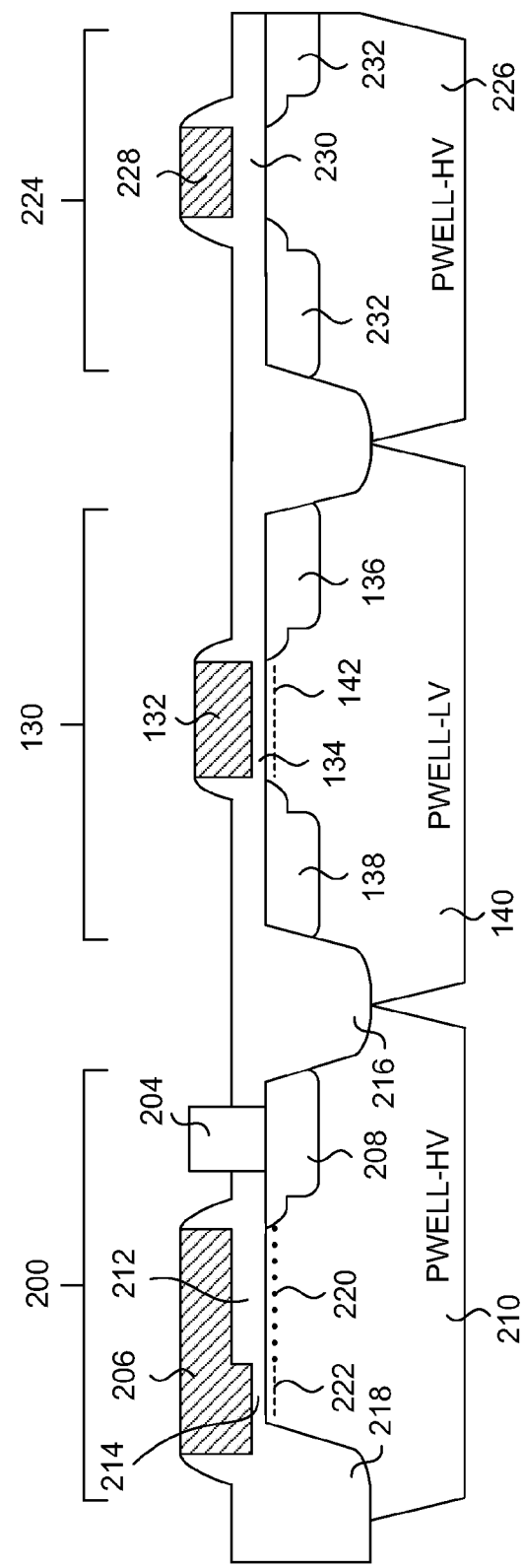
FIG. 7A
FIG. 7B

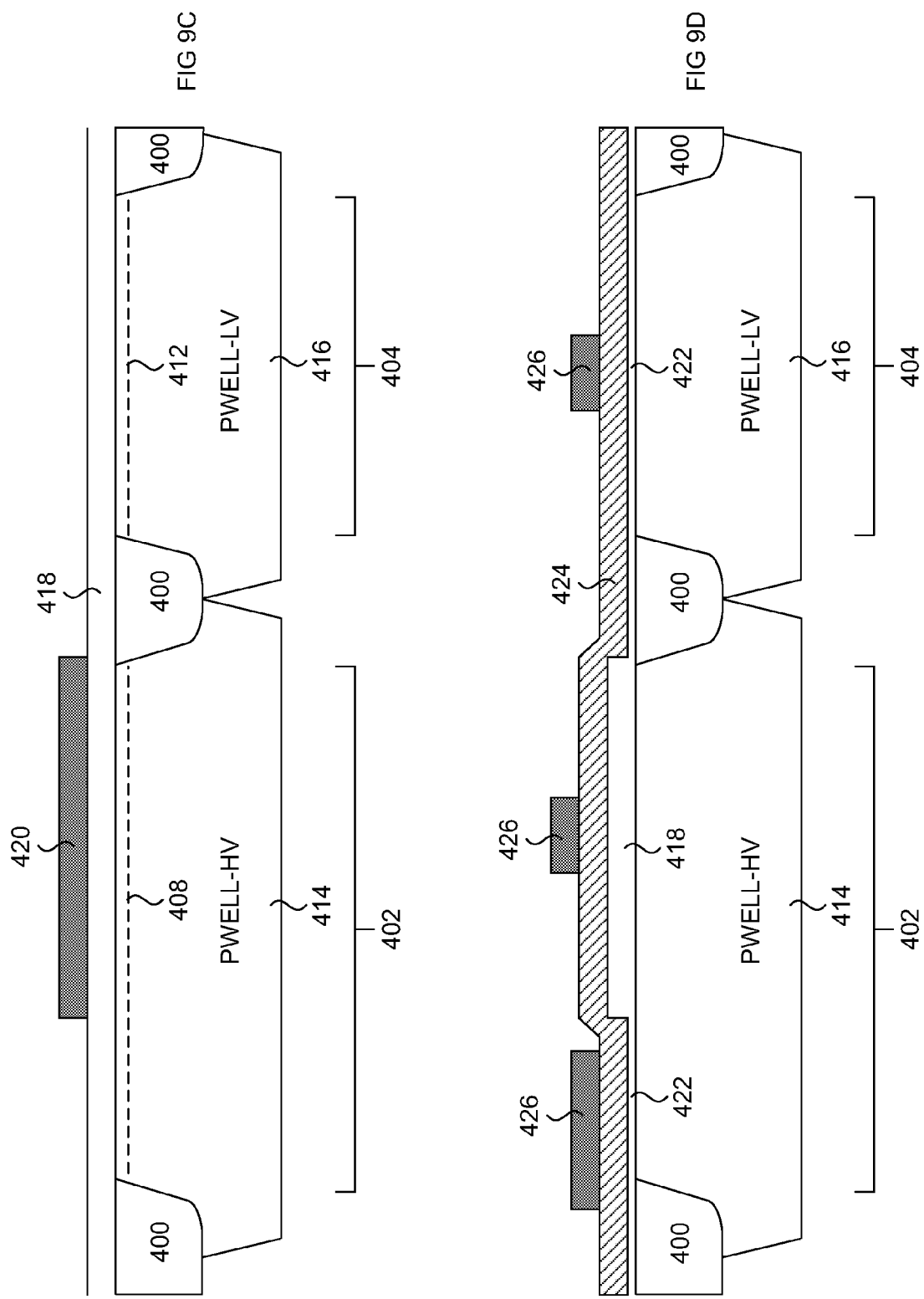

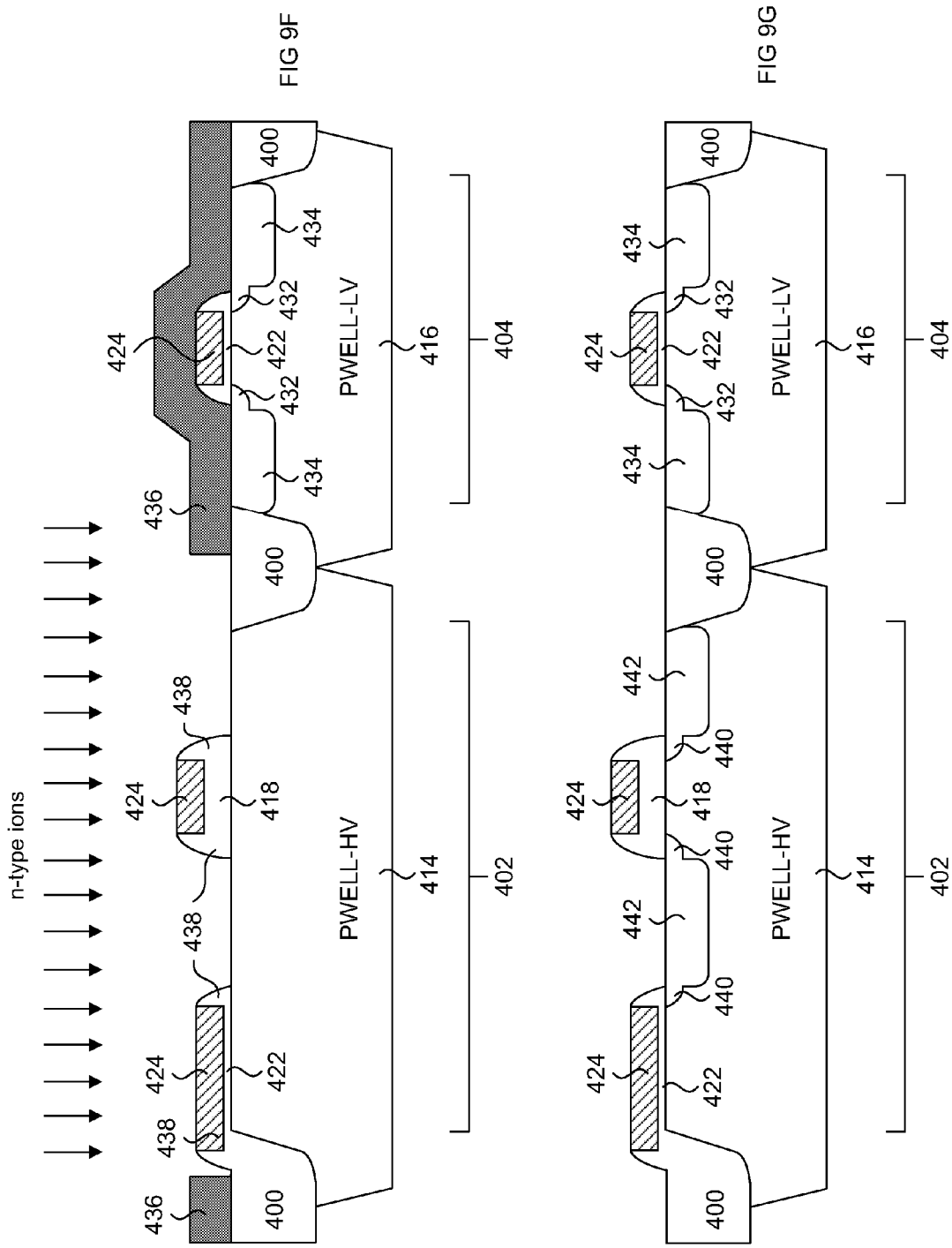

LOW VT ANTIFUSE DEVICE

CROSS REFERENCE TO RELATED APPLICATIONS

This application claims the benefit of priority of U.S. Provisional Patent Application No. 61/042,511 filed on Apr. 4, 2008, which is incorporated herein by reference in its entirety.

FIELD OF THE INVENTION

The present invention relates generally to non-volatile memory. More particularly, the present invention relates to anti-fuse devices.

BACKGROUND OF THE INVENTION

In the following description the term MOS is used to denote any FET or MIS transistor, half-transistor or capacitor structure. In order to simplify the description of the embodiments, references to gate oxides from this point forward should be understood to include dielectric materials, oxide, or a combination of oxide and dielectric materials.

Over the past 30 years, anti-fuse technology has attracted significant attention of many inventors, IC designers and manufacturers. An anti-fuse is a structure alterable to a conductive state, or in other words, an electronic device that changes state from not conducting to conducting. Equivalently, the binary states can be either one of high resistance and low resistance in response to electric stress, such as a programming voltage or current. Anti-fuse devices can be arranged into a memory array, thereby forming what is commonly known as a one-time-programmable (OTP) memory.

Current anti-fuse development is concentrated around 3-dimensional thin film structures and special inter-metal materials. Such anti-fuse technologies require additional processing steps not available in standard CMOS process, prohibiting anti-fuse applications in typical VLSI and ASIC designs, where programmability could help overcome problems with ever shrinking device life cycles and constantly rising chip development costs. Therefore there is an apparent need in the industry for a reliable anti-fuse structures utilizing standard CMOS process.

One type of anti-fuse memory cell manufacturable with a standard CMOS process is disclosed in U.S. Pat. No. 6,667, 902 (Peng). Peng attempts to improve a classic planar DRAM-like anti-fuse array by introducing "row program lines" which connect to the capacitors and run parallel to the word lines. If decoded, the row program lines can minimize exposure of access transistors to a high programming voltage, which would otherwise occur through already programmed cells. Peng further improves his array in U.S. Pat. No. 6,671, 040 by adding a variable voltage controlling programming current, which allegedly controls the degree of gate oxide breakdown, allowing for multilevel or analog storage applications.

FIG. 1 is a circuit diagram of an anti-fuse memory cell disclosed in Peng, while FIGS. 2 and 3 show the planar and cross-sectional views respectively of the anti-fuse memory cell shown in FIG. 1. The anti-fuse memory cell of FIG. 1 includes a pass, or access transistor 10 for coupling a bitline BL to a bottom plate of anti-fuse device 12. Anti-fuse device 12 is considered a gate dielectric breakdown based anti-fuse devices. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses should be reliable while simple to manufacture with a low cost CMOS process.

The gate dielectric breakdown based antifuse devices are gaining popularity as a preferred OTP or emulated multiple time programmable (MTP) non-volatile memory devices in the industry. Such antifuse devices used either in a memory array or as an individual programmable cell consists of at least two regions. First is a high voltage breakdown region and second is a low voltage breakdown region (or anti-fuse region).

FIG. 4 is a cross sectional diagram of an improved version of the anti-fuse memory cell shown in FIG. 1. Just like the anti-fuse memory cell of FIG. 1, FIG. 4 shows a two-transistor anti-fuse memory cell 30, which consists of an access transistor in series with an anti-fuse transistor. The access transistor includes a polysilicon gate 32 overlying a thick gate oxide 34, which itself is formed over the channel 36. On the left side of the channel 36 is a diffusion region 38 electrically connected to a bitline contact 40. On the right side of the channel 36 is a common diffusion region 42 shared with the anti-fuse transistor. The anti-fuse transistor includes a polysilicon gate 44 overlying a thin gate oxide 46, which itself is formed over the channel 48. The thick gate oxide 34 can correspond to that used for high voltage transistors while the thin gate oxide 46 can correspond to that used for low voltage transistors. Polysilicon gates 32 and 44 can be independently controlled, or alternatively can be connected to each other. For example, polysilicon gate 32 can be coupled to a wordline while polysilicon gate 44 can be coupled to a controlled cell plate voltage (VCP). Both diffusion regions 38 and 42 can have LDD regions, which can be identically doped or differently doped, depending on the desired operating voltages to be used. Thick field oxide, or shallow trench isolation (STI) oxide 54 and 56 are formed for isolating the memory cell from other memory cells and/or core circuitry transistors. Commonly owned U.S. patent application Ser. No. 11/762,552 filed on Jun. 13, 2007 describes alternate two-transistor anti-fuse memory cells which can be used in a non-volatile memory array. The thin gate oxide 46 is intended to breakdown in the presence of a large electrical field during a programming operation, thereby creating an electrically conductive connection between channel 48 and polysilicon gate 44. This electrically conductive connection can be referred to as a conductive link or anti-fuse.

Such an anti-fuse device implemented in a standard CMOS process utilizes high voltage (HV) or input/output (I/O) transistors and low voltage (LV) or core transistors to implement the thick dielectric and thin dielectric regions respectively. The fabrication of HV and LV transistors includes the process steps such as well formation and threshold voltage (Vt) adjustment implants. Those skilled in the art will understand that HV transistors are typically used in the I/O circuits such as input and output buffers, or in the circuitry that requires lower leakage and/or higher operating voltage comparing to the core area, where the LV transistors can be used. LV transistors on the other hand are typically used for core circuit transistors, or for circuitry that requires high speed switching performance for example. Accordingly, the electrical characteristics of HV and LV transistors are different since they are designed for specific applications. In the two-transistor anti-fuse memory cell 30, it is desirable to minimize the Vt of the anti-fuse device consisting of polysilicon gate 44. Therefore it is formed using an LV transistor process. As shown in FIG. 4 by example, the anti-fuse device consisting of polysilicon gate 44 is formed in a low voltage p-type well (PWELL-LV) 50 that has a dopant concentration, a Vt implant and gate oxide thickness specifically set for an LV transistor. The pass gate consisting of polysilicon gate 32 is formed in a high voltage p-type well (PWELL-HV) 52 that has a dopant concentration, a Vt implant and a gate oxide thickness specifically set for an HV transistor. Therefore the Vt of the anti-fuse device will be the same as the Vt of a core circuit transistor.

A driving factor for reducing cost of any memory is the memory array area. The two-transistor anti-fuse memory cell 30 of FIG. 4 is a relatively large memory cell when compared to single transistor memory cells, such as flash memory cells for example. A single transistor anti-fuse memory cell is described in commonly owned U.S. Pat. No. 7,402,855.

FIG. 5 is a cross-sectional view of the single transistor anti-fuse memory cell disclosed in commonly owned U.S. Pat. No. 7,402,855. Anti-fuse transistor 60 includes a variable thickness gate oxide 62 formed on the substrate channel region 64, a polysilicon gate 66, sidewall spacers 68, a field oxide region 70 a diffusion region 72, and an LDD region 74 in the diffusion region 72. A bitline contact 76 is shown to be in electrical contact with diffusion region 72. The variable thickness gate oxide 62 consists of a thick gate oxide and a thin gate oxide such that a portion of the channel length is covered by the thick gate oxide and the remaining portion of the channel length is covered by the thin gate oxide. From this point forward, the thin gate oxide portion corresponds to the anti-fuse device portion of the single transistor anti-fuse memory cell while the thick gate oxide portion corresponds to the access transistor portion of the single transistor anti-fuse memory cell. Generally, the thin gate oxide is a region where oxide breakdown can occur. The thick gate oxide edge meeting diffusion region 72 on the other hand, defines an access edge where gate oxide breakdown is prevented and current between the gate 66 and diffusion region 72 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In the presently shown example, the diffusion region 72 is connected to a bitline through a bitline contact 76, or other line for sensing a current from the polysilicon gate 66, and can be doped to accommodate programming voltages or currents. This diffusion region 72 is formed proximate to the thick oxide portion of the variable thickness gate oxide 62. To further protect the edge of anti-fuse transistor 60 from high voltage damage, or current leakage, a resistor protection oxide (RPO), also known as a salicide protect oxide, can be introduced during the fabrication process to further space metal particles from the edge of sidewall spacer 68. This RPO is preferably used during the salicidation process for preventing only a portion of diffusion region 72 and a portion of polysilicon gate 66 from being salicided. It is well known that salicided transistors are known to have higher leakage and therefore lower breakdown voltage. Thus having a non-salicided diffusion region 72 will reduce leakage. Diffusion region 72 can be doped for low voltage transistors or high voltage transistors or a combination of the two resulting in same or different diffusion profiles.

Once again, it is desirable to minimize the Vt of the anti-fuse device defined by the portion of the polysilicon gate 66 over the thin gate oxide portion of the variable thickness gate oxide 62. Therefore it is formed using an LV transistor process. As shown in FIG. 5 by example, the anti-fuse device consisting of polysilicon gate 66 over the thin gate oxide portion is formed in a low voltage p-type well PWELL-LV 78 that has a dopant concentration, a Vt implant and gate oxide thickness specifically set for an LV transistor. The pass gate consisting of polysilicon gate 66 over the thick gate oxide portion of the variable thickness gate oxide 62 is formed in a high voltage p-type well PWELL-HV 80 that has a dopant concentration, a Vt implant and a gate oxide thickness specifically set for an HV transistor. Therefore the Vt of the anti-fuse device will be the same as the Vt of a core circuit transistor.

Unfortunately, foundries for manufacturing semiconductor devices may have set types of LV transistor processes for manufacturing core circuits of the memory device, where the Vt control implant differs depending on the circuit application or function. Semiconductor memory devices generally have three circuit areas. First are the I/O circuits that are connected to pins of the package of the semiconductor memory device. Second are the core circuits, which includes any logic and control circuits for example. Third is the memory array, which includes memory cells. Compounding this problem is the fact that the anti-fuse is typically designed on the basis of a particular LV transistor process, which means that the anti-fuse device has been qualified to operate properly if manufactured according to that particular LV transistor process. If the foundry does not have an LV transistor process suited for the design, then redesign of the anti-fuse device is required in order to qualify it for the available process. Such redesign incurs significant cost overhead, which is necessitated again when the foundry introduces a new generation of the process to accommodate a new manufacturing technology node. For example, an LV process for a 45 nm technology node may be different than that of a 20 nm technology node.

Another problem relevant to the anti-fuse transistor 60 of FIG. 5 is mask alignment error associated with implantation of wells 78 and 80. Because the thin gate oxide portion of the variable thickness gate oxide 66 is small, any mask alignment error becomes significant. This means that too much of well 78 can be formed under the thick gate oxide portion, or too little of well 78 can be formed under the thin gate oxide portion. In either case, defects affecting the proper operation of the single transistor anti-fuse memory cell are more likely to be formed.

Another important issue is reliability of the anti-fuse memory device, and more specifically the quality of the thin gate oxide. The thin gate oxide quality is affected by the condition of the underlying channel surface, the concentration and uniformity of dopants at the channel surface, and implantation damage, just to name a few factors. Generally, the more process steps that the anti-fuse device is subjected to, the higher the probability for producing a defective anti-fuse device. Since anti-fuse based memory devices are programmed after manufacture by end-users, it is difficult to test for the reliability of an anti-fuse device before programming. Therefore the quality of the thin gate oxide should be maximized, since an inadvertently programmed anti-fuse device or an unprogrammable anti-fuse device will likely cause failure in the system. In the automotive industry, such a failure can have catastrophic consequences.

Accordingly, it is difficult to manufacture a consistently low Vt anti-fuse device with current CMOS processes. Therefore, it is desirable to provide an anti-fuse based memory cell that has a minimal Vt while being simple and low cost to manufacture.

SUMMARY OF THE INVENTION

It is an object of the present invention to obviate or mitigate at least one disadvantage of previous anti-fuse memory devices.

In a first aspect, the present invention provides a memory device. The memory device includes a memory array including a plurality of anti-fuse memory cells and a core transistor. Each of the plurality of anti-fuse memory cells include an access transistor and an anti-fuse device. The access transistor has a thick gate oxide formed in a high voltage well, where the high voltage well is one of n-type and p-type. The anti-fuse device has a thin gate oxide formed in the high voltage well, where the thin gate oxide has a thickness less than the thick gate oxide. The core transistor has a gate oxide corresponding in thickness to the thin gate oxide, where the core transistor is formed in a low voltage well having a same type as the high voltage well. According to embodiments of the present aspect, there are input/output transistors formed in another well being substantially identical in type and doping profile to the high voltage well, the anti-fuse device has a lower threshold voltage than the core transistor, and the thick gate oxide includes an intermediate oxide and the thin gate oxide deposited over the intermediate oxide.

In another embodiment, the thin gate oxide is thermally grown on a substrate surface of the first well, and the thick gate oxide includes an intermediate oxide and thermally grown oxide between the intermediate oxide and the substrate surface. In a further embodiment, the access transistor includes a first diffusion region electrically connected to a bitline and a second diffusion region electrically connected to the anti-fuse device, where the access transistor has a threshold voltage greater than the core transistor and the anti-fuse device. In the present embodiment, the anti-fuse device has a variable thickness gate oxide having a thin portion corresponding to the thin gate oxide and a thick portion corresponding to the thick gate oxide, such that the variable thickness gate oxide is formed underneath a single polysilicon gate. Furthermore, channel regions under the thick portion of the variable thickness gate oxide and the access transistor thick gate oxide have substantially the same Vt implant. In yet another embodiment, the access transistor thick gate oxide corresponds to a thick portion of a variable thickness gate oxide, and the anti-fuse device thin gate oxide corresponds to a thin portion of the variable thickness gate oxide, such that the variable thickness gate oxide is formed underneath a single polysilicon gate. In this embodiment, the anti-fuse transistor has a threshold voltage that is less than the access transistor and the core transistor.

In a second aspect, the present invention provides a method for fabricating a memory device. The method includes implanting first wells in a memory array circuit area, the first wells being one of n-type and p-type; implanting second wells in a core circuit area, the second wells being a same type as the first wells; forming a first oxide for access transistors in the first wells of the memory array circuit area; and simultaneously forming a second oxide for core transistors in the second wells of the core circuit area and for anti-fuse devices in the first wells of the memory array circuit area. In one embodiment, the first wells are high voltage wells and the second wells are low voltage wells. In another embodiment, the step of simultaneously forming includes increasing a thickness of the first oxide as the second oxide is being formed, the second oxide corresponding to a thin gate oxide of the anti-fuse devices. In this embodiment, increasing includes depositing the second oxide on a substrate surface and on the first oxide at the same time, the combination of the first oxide and the second oxide forming a thick gate oxide of the access transistors. Alternately, increasing includes thermally growing the second oxide on a substrate surface and underneath the first oxide at the same time, the combination of the first oxide and the second oxide forming a thick gate oxide of the access transistors.

In a further embodiment of the present aspect, the method further includes exposing the first wells to a high threshold voltage adjust implant for adjusting a threshold voltage of the access transistors and the anti-fuse devices. Alternately, the method further includes exposing the first wells to a high threshold voltage adjust implant for adjusting a threshold voltage of the access transistors and the anti-fuse devices while masking channel regions corresponding to the anti-fuse device for inhibiting implantation of the high threshold voltage adjust implant. Alternately, the method further includes exposing the second wells to a low threshold voltage adjust implant for adjusting a threshold voltage of the core transistors, while inhibiting exposure of the antifuse transistors to the low threshold voltage adjust implant.

According to another embodiment, the step of implanting the first wells includes simultaneously implanting the first wells in an input/output circuit area, and the step of forming a first oxide includes simultaneously forming the first oxide of input/output transistors in the first wells of the input/output circuit area. The step of increasing can include depositing the second oxide on the first oxide of the input/output transistors, the combination of the first oxide and the second oxide forming a thick gate oxide of the input/output transistors. The step of exposing can include exposing the first wells to a high threshold voltage adjust implant for adjusting a threshold voltage of the access transistors, the anti-fuse devices and the input/output transistors. An additional step of exposing the second wells to a low threshold voltage adjust implant for adjusting a threshold voltage of the core transistors can be included.

In a third aspect, the present invention provides a memory device. The memory device includes anti-fuse memory cells, input/output transistors, and core transistors. The anti-fuse memory cells are in first wells of a memory array circuit area, the first wells being one of n-type and p-type. The input/output transistors are in the first wells of an input/output area. The core transistors are in second wells in a core circuit area, the second wells being a same type as the first wells, but having a different profile than the first wells. According to embodiments of the third aspect, each of the anti-fuse memory cells includes an access transistor and an anti-fuse device, and the access transistor and the input/output transistors have gate oxides with a first thickness. The anti-fuse device and the core transistors have gate oxides with a second thickness smaller than the first thickness. The access transistor and the input/output transistors have a first threshold voltage, the anti-fuse device has a second threshold voltage less than the first threshold voltage, and the core transistors have a third threshold voltage less than the first threshold voltage and different from the second threshold voltage.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 6A is a plan view of a two-transistor anti-fuse memory cell, according to an embodiment of the present invention;

FIG. 6B is a cross sectional view of the two-transistor anti-fuse memory cell of FIG. 6A taken along line B-B;

FIG. 7A is a plan view of a single transistor anti-fuse memory cell, according to an embodiment of the present invention;

FIG. 7B is a cross sectional view of the single transistor anti-fuse memory cell of FIG. 7A taken along line C-C;

FIGS. 9A to 9G illustrate CMOS process steps used to form the anti-fuse memory cell of FIG. 6B, according to an embodiment of the present invention;

DETAILED DESCRIPTION

Figure 1:
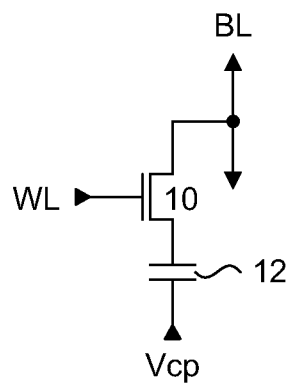
FIG. 1 is a circuit diagram of a DRAM-type anti-fuse cell.

The embodiments of the present invention describe a one time programmable memory cell having an anti-fuse device with a low threshold voltage independent of core circuit process manufacturing technology. A two transistor memory cell having a pass transistor and an anti-fuse device, or a single transistor split channel memory cell having a dual thickness gate oxide, are formed in a high voltage well that is used for forming high voltage transistors. The threshold voltage of the anti-fuse device differs from the threshold voltages of any transistor in the core circuits of the memory device, but has a gate oxide thickness that is the same as a transistor in the core circuits. The pass transistor has a threshold voltage that differs from the threshold voltages of any core circuit transistor, and has a gate oxide thickness that differs from any transistor in the core circuits.

In particular, the embodiments of the present invention achieve a low programmed anti-fuse device threshold voltage without any additional mask layer or CMOS process steps. Furthermore, mask layout is simplified and mask misalignment and mask-dependence of the gate oxide breakdown characteristics is minimized.

FIG. 6A is a plan view of a two-transistor anti-fuse memory cell, according to an embodiment of the present invention. Anti-fuse memory cell 100 is typically formed in a memory array, and includes an access transistor and an anti-fuse transistor. The access transistor, also referred to as a pass transistor, includes active area 102, bitline contact 104 and polysilicon gate 106. The dashed outline 107 defines the areas in which a thick gate oxide is to be formed via a thick gate oxide definition mask during the fabrication process. More specifically, the area enclosed by the dashed outline 107 designates the regions where thick oxide is to be formed. The anti-fuse transistor includes active area 102 and polysilicon gate 108. A first diffusion region 110 is formed in the active area 102 between polysilicon gates 106 and 108, while a second diffusion region 112 is formed in the active area 102 on the other side of the polysilicon gate 106. The bitline contact 104 makes electrical contact with second diffusion region 112. Both the access transistor and the anti-fuse transistor are formed in a common well 114. More specifically, the common well 114 is a high voltage well, such as high voltage p-type well that is used for I/O transistors. Underneath the polysilicon gate 106 and covering the channel area (not shown) is a thick gate oxide. Underneath the polysilicon gate 108 and covering the channel region (not shown) is a thin gate oxide where localized breakdown for forming an anti-fuse is intended.

FIG. 6B is a cross-sectional view of anti-fuse memory cell 100 taken along line B-B. For comparison purposes, FIG. 6B also shows a cross-sectional view of a core circuit transistor that would be formed in the same substrate as anti-fuse memory cell 100. FIG. 6B clearly shows a thick gate oxide 116 underneath polysilicon gate 106, and a thin gate oxide 118 underneath polysilicon gate 108. The diffusion regions 110 and 112 have LDD regions extending under the sidewall spacers adjacent polysilicon gates 106 and 108, and field oxide such as STI 120 and 122 are included for isolating anti-fuse memory cell 100 from other memory cells or core circuits, such as core circuit transistor 130. Core circuit transistor 130 includes a polysilicon gate 132 formed over a thin gate oxide 134, and diffusion regions 136 and 138. The diffusion regions have LDD regions extending under the sidewall spacers adjacent to polysilicon gate 132. This core circuit transistor 130 can be representative of all transistors used in the core circuits for operating the memory array, such as control logic or decoding logic for example, and is formed in well 140 that is different than well 114. More specifically, since core circuit transistor 130 may be designed for high performance, well 140 will be a low voltage p-type well (PWELL-LV), which differs from the high voltage p-type well (PWELL-HV), 114.

Several notable features of the anti-fuse memory cell 100 are now described. The thin gate oxide 118 of the anti-fuse device and the thin gate oxide 134 of the core circuit transistor 130 can be identical to each other, meaning that they are formed with substantially the same thickness. If multiple core device types exist in the same wafer (as in the case of triple gate oxide process) the antifuse thin gate oxide 118 would be identical to the gate oxide of one of the core transistor devices.

Furthermore, the gate oxide thickness 116 is usually different than that of all core circuit transistors, and is typical the same as the gate oxide thickness of the I/O circuit transistors. This is achieved by growing both thin gate oxides 118 and 134 at the same time by using the same LV transistor process. Although the thin gates oxides 118 and 134 are the same, the threshold voltage of the anti-fuse device and the core circuit transistor 130 are different. Persons skilled in the art understand that the core circuit transistor 130 has an LV transistor Vt implant 142 in the channel 140 between the diffusion regions 136 and 138 to raise the Vt from the native Vt due to well 140. However, the channel regions under the thick gate oxide 116 and thin gate oxide 118 are exposed to the same HV transistor Vt adjust implant step, thereby resulting in different Vt implants 126 and 128 due to the differing thicknesses of the gate oxides. The channel region underneath thick gate oxide 116 will have HV transistor Vt implant 126 that is used for adjusting the Vt of I/O transistors to a desired value, such as 0.6 volts for example. The channel region underneath thin gate oxide 118 will have Vt implant 128 that results in a Vt being a scaled factor of the resulting Vt corresponding to the thick gate oxide 116. Once again, this scaling factor is related to the difference in thickness between thick gate oxide 116 and the thin gate oxide 118. Alternately, the channel region under the thin gate oxide 118 can be masked during the HV transistor Vt adjust implant step, thereby preventing any Vt adjust implantation into this region. Accordingly, the Vt under the thin gate oxide portion 118 will be the native Vt due to well 114.

An advantage of using high voltage processes for manufacturing the anti-fuse memory cells is the fact that high voltage CMOS processes remain substantially constant with the introduction of each new low voltage CMOS process. Therefore, if the core circuits are fabricated with new advanced low voltage processes in order to attain improved performance, the anti-fuse memory cells will have characteristics that remain substantially constant from process generation to process generation. Therefore no redesign of the anti-fuse memory cells is required as the low voltage processes change.

Figure 2:
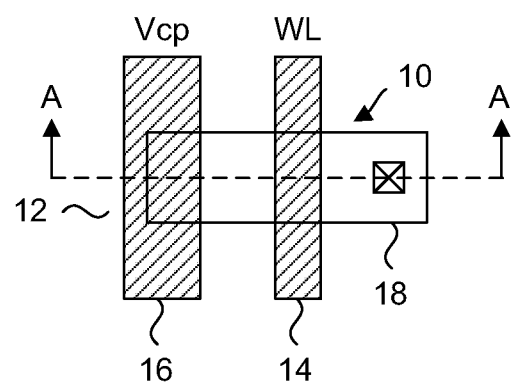
FIG. 2 is a planar layout of the DRAM-type anti-fuse cell of FIG. 1.
Figure 3:
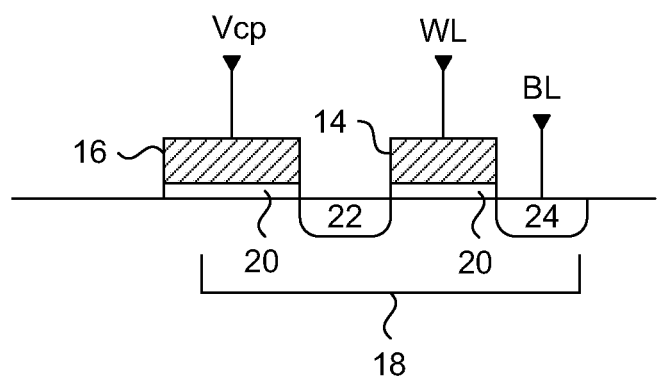
FIG. 3 is a cross-sectional view of the DRAM-type anti-fuse cell of FIG. 2 along line A-A.
Figure 4:
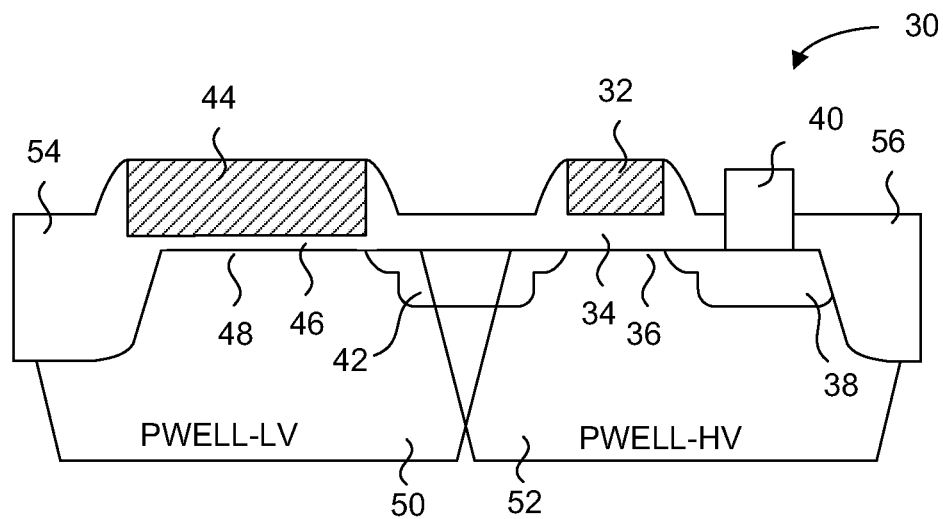
FIG. 4 is a cross-sectional view of a two-transistor anti-fuse memory cell.
Figure 5:
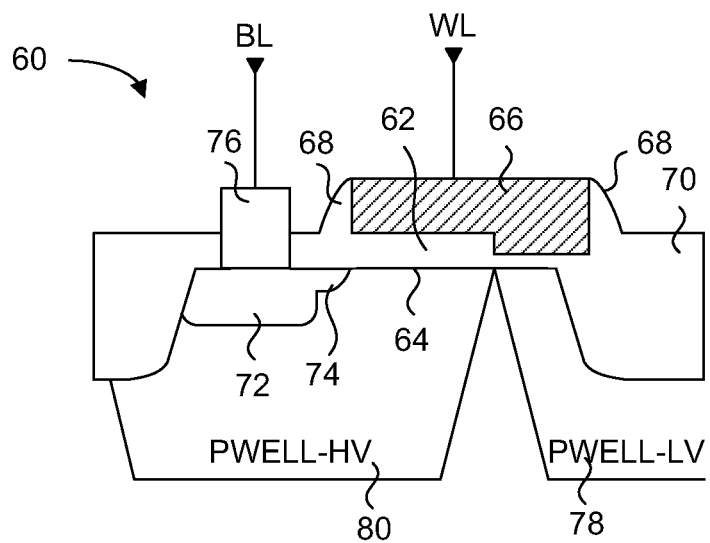
FIG. 5 is a cross-sectional view of a single transistor anti-fuse memory cell.

The above example two-transistor anti-fuse memory cell 100 can have polysilicon gates 106 and 108 connected to each other and driven by a wordline, or they can be individually driven using separate wordline and Vcp lines in the same way as the two-transistor anti-fuse memory cell of FIGS. 1 and 2. In either case, such a memory cell may not be suited for high density applications where a minimal use of semiconductor area is required by minimizing the memory array footprint. In such applications, the single transistor anti-fuse memory cell of FIG. 7A can be used.

FIG. 7A is a plan view of a single-transistor anti-fuse memory cell, according to an embodiment of the present invention. Anti-fuse memory cell 200 is typically formed in a memory array, and includes the previously described variable thickness gate oxide of U.S. Pat. No. 7,402,855. Anti-fuse memory cell 200 includes active area 202, bitline contact 204, polysilicon gate 206 and diffusion region 208 formed in the active area 202. The bitline contact 204 makes electrical contact with diffusion region 208. Anti-fuse memory cell 200 is formed in a common well 210, which is a high voltage well such as the high voltage p-type well that is used for I/O transistors. Common well 210 can be the same as common well 114 of FIG. 6B. Underneath the polysilicon gate 206 and covering the channel area (not shown) is a variable thickness gate oxide. The dashed outline 211 defines the areas in which a thick gate oxide is to be formed via a thick gate oxide definition mask during the fabrication process.

FIG. 7B is a cross-sectional view of anti-fuse memory cell 200 taken along line C-C. For comparison purposes, FIG. 7B also shows a cross-sectional view of the same core circuit transistor 130 shown in FIG. 6B, that would be formed in the same substrate as anti-fuse memory cell 200. FIG. 7B clearly shows the variable thickness gate oxide underneath polysilicon gate 206, which has a thick gate oxide portion 212 and a thin gate oxide portion 214. The thick gate oxide portion 212 is defined using the thick gate oxide definition mask 211. The diffusion region 208 has an LDD region extending under the sidewall spacer adjacent polysilicon gate 206, and field oxide such as STI 216 and 218 are included for isolating anti-fuse memory cell 200 from other memory cells or core circuits, such as core circuit transistor 130. Core circuit transistor 130 includes the same numbered elements previously described in FIG. 6B. Once again, this core circuit transistor 130 can be representative of all transistors used in the core circuits for operating the memory array, such as control logic or decoding logic for example, and is formed in well 140 that is different than well 210. In the present example, well 140 is a low voltage p-type well (PWELL-LV), which differs from the high voltage p-type well (PWELL-HV), 210.

Also shown in FIG. 7B to the right of core circuit transistor 130 is an I/O transistor 224 formed on a p-type well (PWELL-HV) 226, which is of the same type and profile as p-type well 210. I/O transistor 224 has a polysilicon gate 228 formed over a thick gate oxide 230. Adjacent to the right and left sides of polysilicon gate 228 are diffusion regions 232. Thick gate oxide 230 can be formed in the same manner that thick gate oxide portion 212 is formed, therefore they both would have substantially the same thickness.

Several notable features of the anti-fuse memory cell 200 are now described. The thin gate oxide portion 214 of the variable thickness gate oxide and the thin gate oxide 134 of the core circuit transistor 130 are identical to each other, meaning that they are formed with substantially the same thickness. U.S. Pat. No. 7,402,855 teaches that the thin gate oxide portion 214 is first formed at the same time that thin gate oxides for LV transistors are formed. Although the gates oxides 214 and 134 are the same, the threshold voltage of the anti-fuse device and the core circuit transistor 130 are different. As previously discussed, core circuit transistor 130 includes an LV transistor Vt implant 142 in the channel between the diffusion regions 136 and 138 to raise the Vt from the native Vt due to well 140. The channel region between diffusion region 208 and STI 218 is exposed to the same HV transistor Vt adjust implant step, thereby resulting in different Vt implants 220 and 222 due to the differing thicknesses of the variable thickness gate oxide. The channel region underneath thick gate oxide portion 212 will have HV transistor Vt implant 220 that is used for adjusting the Vt of I/O transistors to a desired value, such as 0.6 volts for example. The channel region underneath thin gate oxide portion 214 will have Vt implant 222 that results in a Vt being a scaled factor of the resulting Vt corresponding to the thick gate oxide portion 212. Once again, this scaling factor is related to the difference in thickness between thick gate oxide portion 212 and the thin gate oxide portion 214. Alternately, the channel region under the thin gate oxide portion 214 can be masked during the HV transistor Vt adjust implant step, thereby preventing any Vt adjust implantation into this region. Accordingly, the Vt under the thin gate oxide portion 214 will be similar to the native Vt determined by the well doping of well 210, but partially modified by the HV transistor Vt implantation due to mask alignment error. The threshold voltage of the anti-fuse device will be lower than the threshold voltage of the core transistor having substantially the same thin gate oxide thickness.

Figures 8A, 8B:
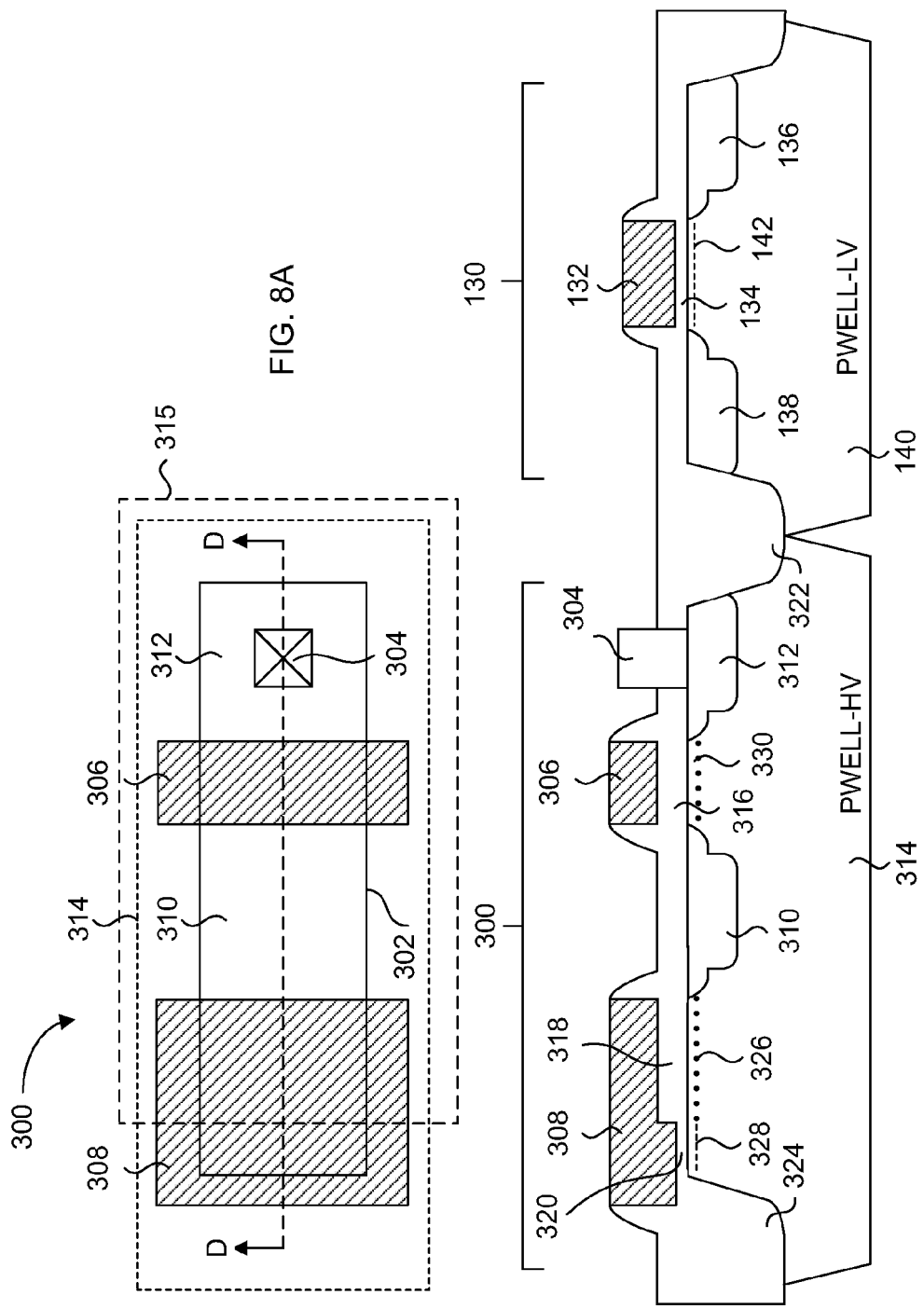
FIG. 8A is a plan view of an alternate two-transistor anti-fuse memory cell, according to an embodiment of the present invention.
FIG. 8B is a cross sectional view of the two-transistor anti-fuse memory cell of FIG. 8A taken along line D-D.

An alternate embodiment of a two transistor anti-fuse memory cell is shown in FIG. 8A. FIG. 8A is a plan view of a two-transistor anti-fuse memory cell, according to an embodiment of the present invention. Anti-fuse memory cell 300 is typically formed in a memory array, and includes an access transistor and an anti-fuse transistor. The access transistor can be identical to the one shown in FIG. 6A, and includes active area 302, bitline contact 304 and polysilicon gate 306. The anti-fuse transistor can have a variable thickness gate oxide identical to the one shown in FIG. 7A, and includes active area 302 and polysilicon gate 308. A first diffusion region 310 is formed in the active area 302 between polysilicon gates 306 and 308, while a second diffusion region 312 is formed in the active area 302 on the other side of the polysilicon gate 306. The bitline contact 304 makes electrical contact with second diffusion region 312. Both the access transistor and the anti-fuse transistor are formed in a common well 314. More specifically, the common well 314 is a high voltage well, such as high voltage p-type well that is used for I/O transistors. The dashed outline 315 defines the areas in which a thick gate oxide is to be formed via a thick gate oxide definition mask during the fabrication process. Underneath the polysilicon gate 306 and covering the channel area (not shown) is a thick gate oxide.

FIG. 8B is a cross-sectional view of anti-fuse memory cell 300 taken along line D-D. For comparison purposes, FIG. 8B also shows a cross-sectional view of the same core circuit transistor 130 shown in FIG. 6B, that would be formed in the same substrate as anti-fuse memory cell 300. FIG. 8B clearly shows a thick gate oxide 316 underneath polysilicon gate 306, and the variable thickness gate oxide having a thick gate oxide portion 318 and a thin gate oxide portion 320 underneath polysilicon gate 308. The thick gate oxide 316 and the thick gate oxide portion 318 are both defined using the thick gate oxide definition mask 315. The diffusion regions 310 and 312 have LDD regions extending under the sidewall spacers adjacent polysilicon gates 306 and 308, and field oxide such as STI 322 and 324 are included for isolating anti-fuse memory cell 300 from other memory cells or core circuits, such as core circuit transistor 130. Core circuit transistor 130 includes the same numbered elements previously described in FIG. 6B.

Several notable features of the anti-fuse memory cell 300 are now described. The thin gate oxide portion 320 of the variable thickness gate oxide and the thin gate oxide 134 of the core circuit transistor 130 are identical to each other, meaning that they are formed with substantially the same thickness. Although the gates oxides 320 and 134 are the same, the threshold voltage of the anti-fuse device and the core circuit transistor 130 are different. As previously discussed, core circuit transistor 130 includes an LV transistor Vt implant 142 in the channel 140 between the diffusion regions 136 and 138 to raise the Vt from the native Vt due to well 140. The channel region between diffusion region 310 and STI 324 is exposed to the same HV transistor Vt adjust implant step, thereby resulting in different Vt implants 326 and 328 due to the differing thicknesses of the variable thickness gate oxide. The channel region underneath thick gate oxide portion 318 will have HV transistor Vt implant 326 that is used for adjusting the Vt of I/O transistors to a desired value, such as 0.6 volts for example. The channel region underneath thin gate oxide portion 320 will have a Vt implant 328 that results in a Vt being a scaled factor of the resulting Vt corresponding to the thick gate oxide portion 318. Once again, this scaling factor is related to the difference in thickness between thick gate oxide portion 318 and the thin gate oxide portion 320. Alternately, the channel region under the thin gate oxide portion 320 can be masked during the HV transistor Vt adjust implant step, thereby preventing any Vt adjust implantation into this region. Accordingly, the Vt under the thin gate oxide portion 320 will be the native Vt due to well 210. The thick gate oxide 316 of the access transistor is thicker than the gate oxide of any transistor in the core circuits, but has an HV transistor Vt implant 330 substantially the same as an I/O transistor. Since the gate oxide thicknesses of portions 318 and 316 are substantially the same, then Vt implants 320 and 336 will be substantially the same. In the present embodiment, the channels under thick gate oxide 318 and thin gate oxide portion 320 are exposed to the same HV transistor Vt implantation step.

The previously shown anti-fuse memory cells are examples of possible shapes for the two-transistor and the single transistor anti-fuse memory cells. Other possible shapes for the anti-fuse memory cells can be used, as demonstrated in commonly owned U.S. Patent Publication No. 2007/0257331. U.S. Patent Publication No. 2007/0257331 teaches anti-fuse memory cell shapes that minimize the thin gate oxide area. Accordingly, the embodiments of the present invention can be applied to anti-fuse memory cells having the alternate shapes shown in U.S. Patent Publication No. 2007/0257331.

In all the anti-fuse memory cell embodiments shown in FIGS. 6B, 7B and 8B, all the transistors of the anti-fuse memory cell are formed in the same high voltage well, where the high voltage well can be the same as the one used for I/O transistors. Since the high voltage well is inherently designed to minimize leakage between adjacent devices separated by STI, the Vt implant of the anti-fuse device can be omitted. This results in a Vt that is lower than any core circuit transistor on the same semiconductor substrate. Alternately, the anti-fuse devices have channels exposed to the same high voltage Vt implant step that the thick gate oxide access transistor or thick gate oxide portion are exposed to. This results in a Vt for the anti-fuse device that differs from the Vt of any core circuit transistor, resulting in better controlled or relatively lower Vt, and/or lower silicon damage due to the ion implantation. The fabrication of the anti-fuse memory cells shown in FIGS. 6B, 7B and 8B uses existing CMOS process steps for fabricating the I/O transistors and the core circuit transistors without any additional masking steps, thereby minimizing the fabrication cost of the entire semiconductor device.

Figure 9A:
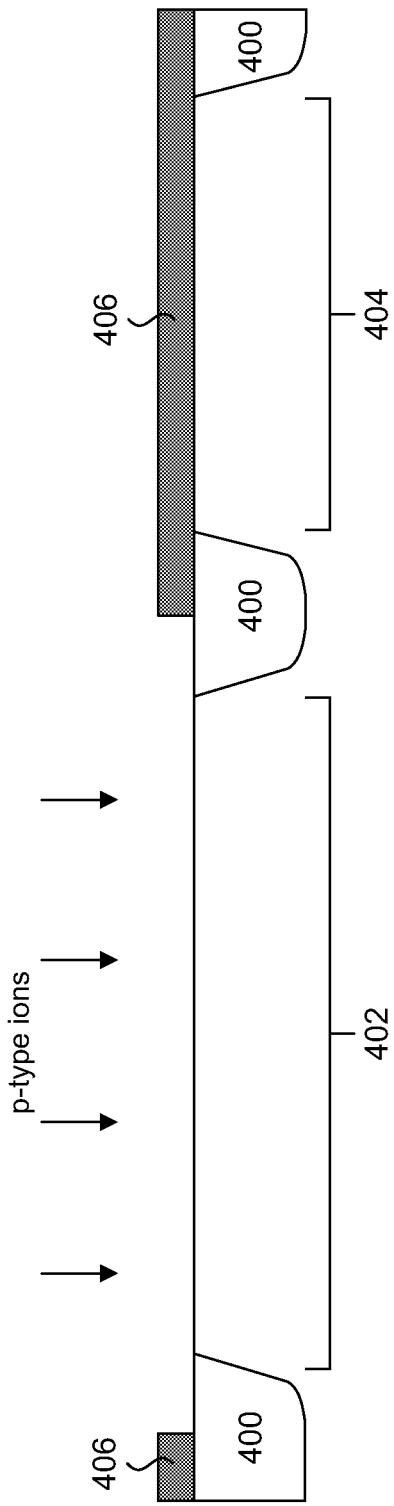

FIGS. 9A to 9G shows various steps in a CMOS process used to form the anti-fuse memory cell of FIG. 6B, at the same time a core circuit transistor is formed. Only specific steps are shown in FIGS. 9A to 9G for illustrating the differences between the anti-fuse memory cell embodiment of the present invention and a core circuit transistor. Persons skilled in the art understand that other non-illustrated steps are executed for forming the structures of the transistors. In FIG. 9A, the STI oxide 400 have been formed in the memory array area 402, core circuit area 404 and the I/O circuit area (not shown). An implant mask 406 is formed over the core circuit area 404, and the exposed substrate not covered by mask 406 is bombarded with p-type ions for forming a high voltage p-type well. It is noted that the high voltage p-type well for the I/O transistor structures are formed at the same time. Subsequently, an optional high voltage Vt adjust implant for the memory array area 402 and the I/O transistors is performed. It is noted that the high voltage Vt adjust implant may not be necessary if the desired Vt level is achieved directly using HV well ion implantation. Alternately, the area corresponding to the channel region of the anti-fuse transistor or device can be masked after the p-type ions for forming a high voltage p-type well have been implanted, such that this region does not receive any high voltage Vt adjust implant.

Figure 9B:
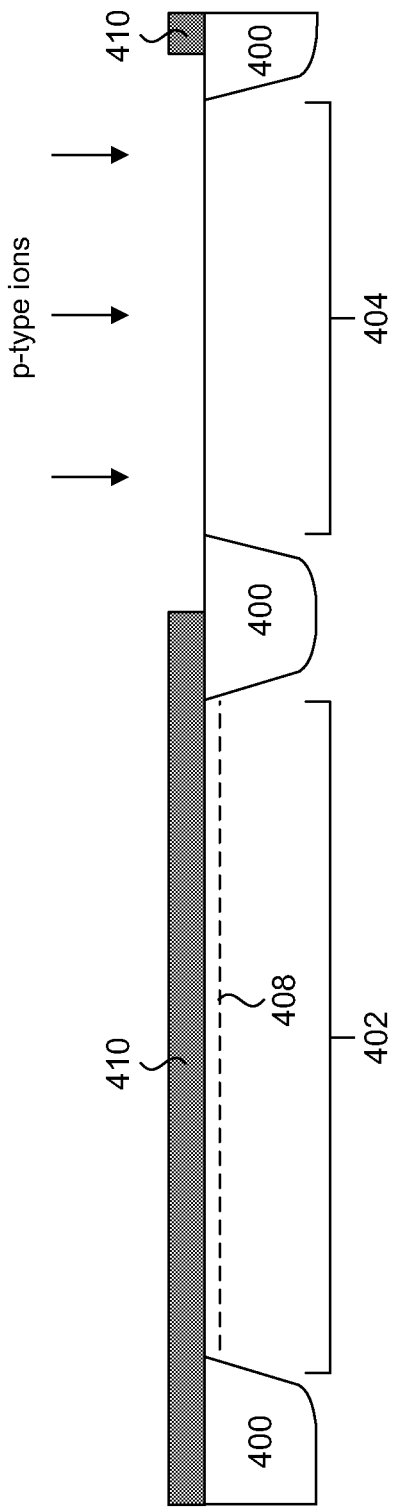

In FIG. 9B, the memory array area 402 with the PWELL-HV implant and high voltage Vt adjust implant 408 is covered by mask 410 so that the exposed substrate corresponding to core circuit area 404 not covered by mask 410 is bombarded with p-type ions for forming a low voltage p-type well. Subsequently, a low voltage Vt adjust implant for the core circuit area 404 is performed, which is shown in FIG. 9C as low voltage Vt adjust implant 412. The structures shown in FIG. 9C result from several process steps. First a drive-in step is performed to diffuse implanted p-type ions within the substrate to form the HV p-type well 414 and the LV p-type well 416. Second, an intermediate oxide 418 is grown over the substrate of both the memory array area 402 and the core circuit area 404. Third, a thick gate oxide (OD2) definition mask 420 is deposited on the intermediate oxide 418 in selected regions of the memory array area 402 and the I/O circuit area (not shown) for defining thick gate oxides. The absence of mask 420 in the core circuit area means that no high voltage transistor is to be formed therein. In a following oxide etching step, any intermediate oxide 418 not covered by mask 420 is etched down to the substrate surface in preparation for thin gate oxide formation.

In FIG. 9D, a thin oxide 422 is formed on the exposed substrate surface in the memory array area 402 and the core circuit area 404. There are two different techniques which can be used for forming the thin oxide 422. A first technique is the one shown in FIG. 9D, where the thin oxide 422 is thermally grown on the exposed substrate surface. In this technique, the thin oxide 422 will also grow underneath the intermediate oxide 418, which pushes the intermediate oxide 418 up and away from the substrate surface. The growth rate underneath the intermediate oxide 418 is lower than in areas where there is no intermediate oxide 418 covering the substrate surface. While it is not shown in FIG. 9D, the intermediate oxide 418 is lifted above the substrate surface by thermally grown thin oxide. A second technique is deposition of the thin oxide 422 over the exposed substrate surface and the exposed surface of the intermediate oxide 418. In either case, the resulting thick gate oxide will be a sum of the intermediate oxide plus thermally grown thin oxide from underneath the intermediate layer or thin oxide deposited on top of the intermediate layer.

Since the I/O transistors are intended to have thick gate oxides, the I/O transistor areas would already have the intermediate oxide 418. Following the growth of the thin oxide 422, gate polysilicon 424 is deposited over the entire substrate, which includes the memory array area 402, the core circuit area 404, and any I/O transistor areas. As shown in FIG. 9D, the gate polysilicon 424 is deposited over the thin oxide 422 and the thicker intermediate oxide 418. In order to define the specific shape of the gate polysilicon 424, a gate mask 426 is deposited over selected areas of the gate polysilicon 424. Following deposition of the gate mask 426, all the exposed gate polysilicon 424 not covered by gate mask 426 is etched away, leaving stacks of polysilicon gates over thin or thick (intermediate) oxides in the memory array area 402, the core circuit area 404, and the I/O circuit area.

Figure 9E:
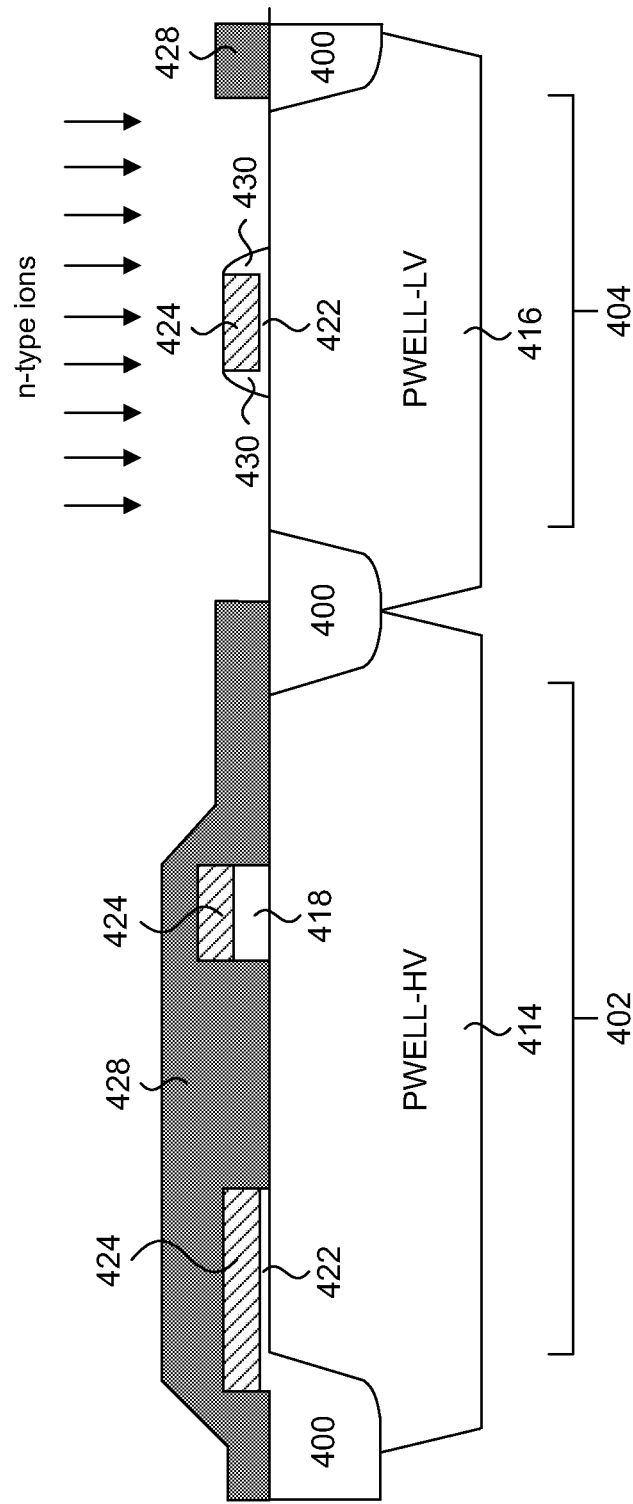

FIG. 9E shows three such stacks resulting from the gate polysilicon etch step, two being in the memory array area 402 and one being in the core circuit area 404. In memory array area 402, the stack consisting of gate polysilicon 424 over thin oxide 422 is the anti-fuse transistor device while gate polysilicon 424 over the thick (intermediate) oxide 418 is the access transistor. In core circuit area 404, the stack consisting of gate polysilicon 424 over thin oxide 422 is a low voltage transistor used in a logic circuit, for example. In FIG. 9E, a diffusion mask 428 is deposited over memory array area 402 and the I/O circuit area, thereby allowing for the formation of LDD regions (not shown) and sidewall spacers 430 adjacent to the gate polysilicon 424 of all the low voltage transistors in the core circuit area 404. After formation of the sidewall spacers 430, the exposed substrates are exposed to n-type diffusion implantation for forming source and drain diffusion regions for all the low voltage transistors in the core circuit area 404. The resulting LDD regions 432 and diffusion regions 434 for the low voltage transistors in the core circuit area 404 are shown in FIG. 9F, and have concentrations specifically designed for the low voltage transistors.

In FIG. 9F the diffusion mask 428 has been removed, and the low voltage transistors in the core circuit area 404 are covered with another diffusion mask 436. Now the transistors of the memory array area 402 are exposed to LDD implants, the formation of sidewall spacers 438, and diffusion region implantation. FIG. 9G shows the completed anti-fuse memory cell having LDD regions 440 and diffusion regions 442, and the completed low voltage transistor in the core circuit area 404. The resulting LDD regions 440 and diffusion regions 442 for the high voltage transistors in the memory array area 402 are shown in FIG. 9F, and have concentrations specifically designed for the high voltage transistors. At this point, all the transistors of the device are subjected to n-type implant diffusion annealing to activate the implanted dopants and to heal any implant damage. It is noted that the anti-fuse memory cell and low voltage transistor of FIG. 9F are the same as the corresponding ones shown in FIG. 6B. Fabrication of the anti-fuse memory cells and all other transistors is completed, and subsequent process steps would be executed for forming bitline contacts and depositing conductive tracks for interconnecting the transistor devices.

FIGS. 9A to 9G illustrate example steps in a CMOS fabrication process for forming a two-transistor anti-fuse memory cell and a low voltage core circuit transistor. The anti-fuse transistor and the low voltage core circuit transistor have thin gate oxides formed using the same gate oxide formation process, but have Vt implants and effective thresholds which differ. Because the entire high voltage p-well 414 is initially subjected to a common high voltage Vt implant, both the access transistor and the anti-fuse transistor have the same implant, but will have different effective Vt's. More specifically, the high voltage Vt implant is intended to ensure that the effective Vt of the access transistor having the thick gate oxide is at a specific value, such as 0.6V for example. Therefore the effective Vt of the anti-fuse transistor is less than 0.6V since its gate oxide is thinner. In an alternate embodiment, the channel under the thin oxide 422 of the anti-fuse transistor can be inhibited from receiving the high voltage Vt implant, thereby further reducing its effective Vt. The low voltage core circuit transistor is subjected to a low voltage Vt implant, which is intended to ensure that its effective Vt is at a specific value, such as 0.6V for example. In any case, the resulting effective Vt of the anti-fuse transistor will always be different than that of any low voltage core circuit transistor.

Figure 10A:
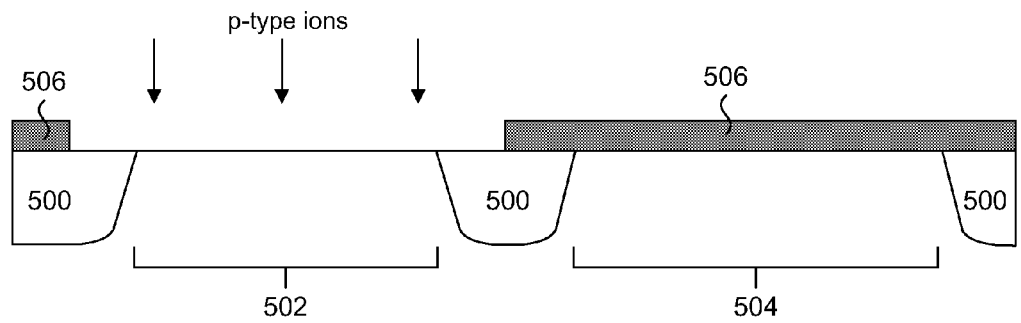
FIGS. 10A to 10G illustrate CMOS process steps used to form the anti-fuse memory cell of FIG. 7B, according to an embodiment of the present invention.

FIGS. 10A to 10G shows various steps in a CMOS process used to form the anti-fuse memory cell of FIG. 7B, at the same time a core circuit transistor is formed. Only specific steps are shown in FIGS. 10A to 10G for illustrating the differences between the anti-fuse memory cell embodiment of the present invention and a core circuit transistor. Persons skilled in the art understand that other non-illustrated steps are executed for forming the structures of the transistors. In FIG. 10A, the STI oxide 500 are formed in the memory array area 502, core circuit area 504 and the I/O circuit area (not shown). An implant mask 506 is formed over the core circuit area 504, and the exposed substrate not covered by mask 506 is bombarded with p-type ions for forming a high voltage p-type well. It is noted that the high voltage p-type well for the I/O transistor structures are formed at the same time. Subsequently, a high voltage Vt adjust implant for the memory array area 502 and the I/O transistors is performed. Alternately, the area corresponding to the channel region of the anti-fuse device portion can be masked after the p-type ions for forming a high voltage p-type well have been implanted, such that this region does not receive any high voltage Vt adjust implant.

Figure 10B:
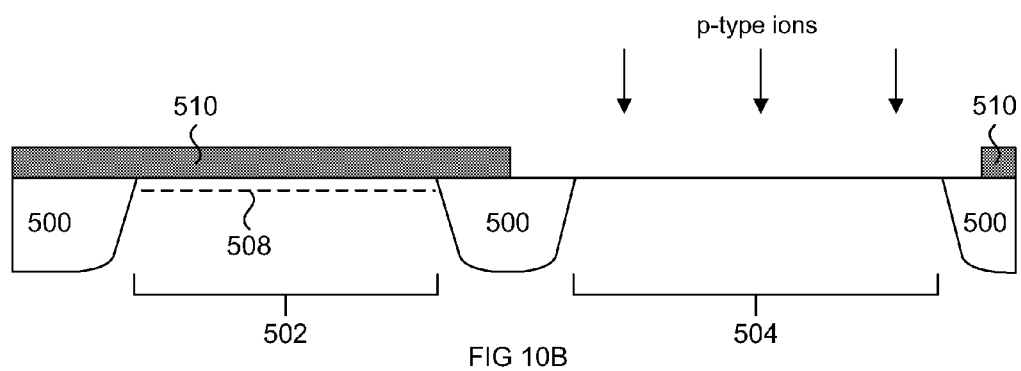
Figure 10C:
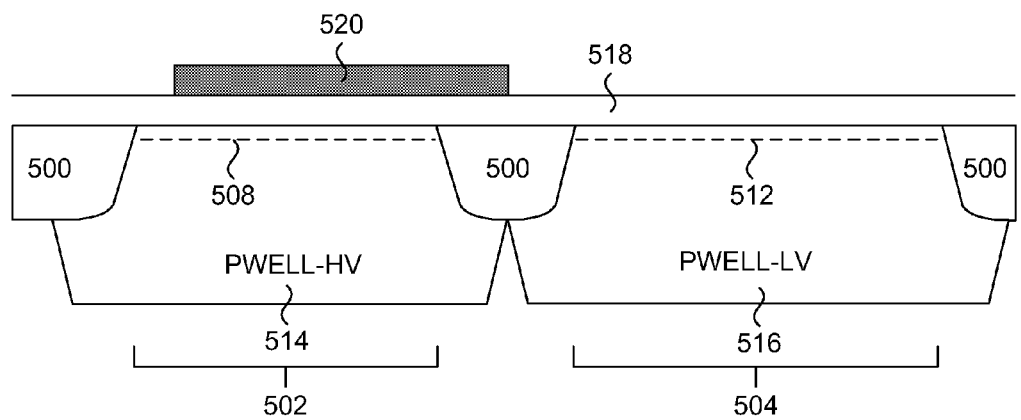

In FIG. 10B, the memory array area 502 with the high voltage Vt adjust implant 508 is covered by mask 510 so that the exposed substrate corresponding to core circuit area 504 not covered by mask 510 is bombarded with p-type ions for forming a low voltage p-type well. Subsequently, a low voltage Vt adjust implant for the core circuit area 504 is performed, which is shown in FIG. 10C as low voltage Vt adjust implant 512. It should be noted at this time that there are different variations in the well formation and Vt adjust implantation process, of which the above described sequence is one example process. For example, the same well implant can be used for both low and high voltage transistors, but different Vt adjustment implants can be used. Alternately, two separate well implants can be used for the low and high voltage transistors, while the same Vt adjust implant is used for both wells. It may even be possible to omit certain Vt adjust implants. Maximum flexibility is obtained when both low and high voltage transistors have their own well implants and Vt adjust implants. This may be desired to obtain a high level of control over the well profiles and precision of the transistor threshold voltages. There may be situations where different high voltage transistors are available in a process, therefore each different type of high voltage transistor may have different well and Vt adjust implants. To improve cost efficiency, a Vt adjust implant can be done using existing masks, such as a P-well or diffusion (LDD) masks for example.

The structures shown in FIG. 10C result from several process steps. First a drive-in step is performed to diffuse implanted p-type ions within the substrate to form the high voltage p-type well 514 and the low voltage p-type well 516. Second, an intermediate oxide 518 is grown over the substrate of both the memory array area 502 and the core circuit area 504. Third, a thick gate oxide (OD2) definition mask 520 is deposited on the intermediate oxide 518 in selected regions of the memory array area 502 and the I/O circuit area (not shown) for defining thick gate oxides. The absence of mask 520 in the core circuit area means that no high voltage transistor is to be formed therein. In a following oxide etching step, any intermediate oxide 518 not covered by mask 520 is etched down to the substrate surface in preparation for thin gate oxide formation.

Figure 10D:
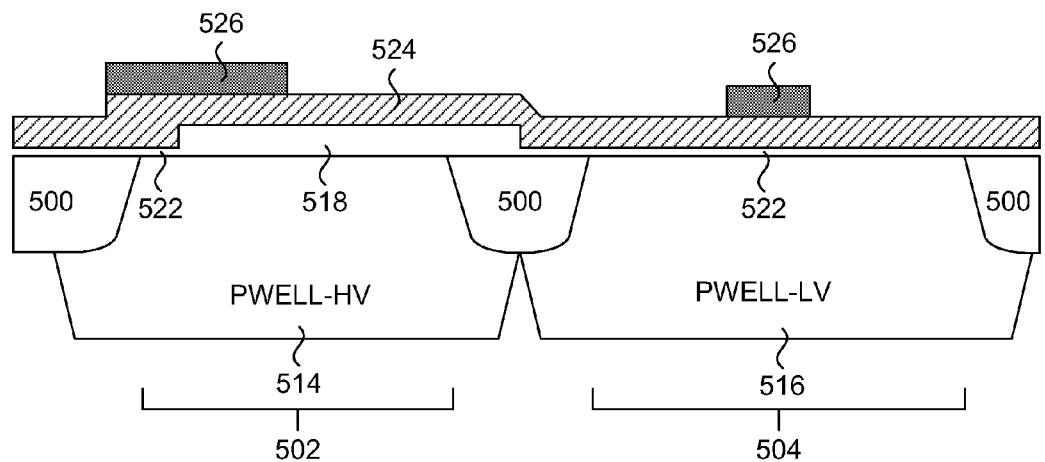

In FIG. 10D, a thin oxide 522 is grown on the exposed substrate surface in the memory array area 502 and the core circuit area 504. Since the I/O transistors are intended to have thick gate oxides, the I/O transistor areas would already have the intermediate oxide 518. Following the growth of the thin oxide 522, gate polysilicon 524 is deposited over the entire substrate, which includes the memory array area 502, the core circuit area 504, and any I/O transistor areas. As shown in FIG. 10D, the gate polysilicon 524 is deposited over the thin oxide 522 and the thicker intermediate oxide 518. In order to define the specific shape of the gate polysilicon 524, a gate mask 526 is deposited over selected areas of the gate polysilicon 524. It is noted that the variable thickness gate oxide of the single transistor anti-fuse memory cell is now defined by the position of the gate mask 526 in the core circuit area 504. More specifically, gate mask 526 in the core circuit area 504 covers both the thin oxide 522 and the thicker intermediate gate oxide 518. Following deposition of the gate mask 526, all the exposed gate polysilicon 524 not covered by gate mask 526 is etched away, leaving stacks of polysilicon gates over thin and thick (intermediate) oxides in the memory array area 502, the core circuit area 504, and the I/O circuit area.

Figure 10E:
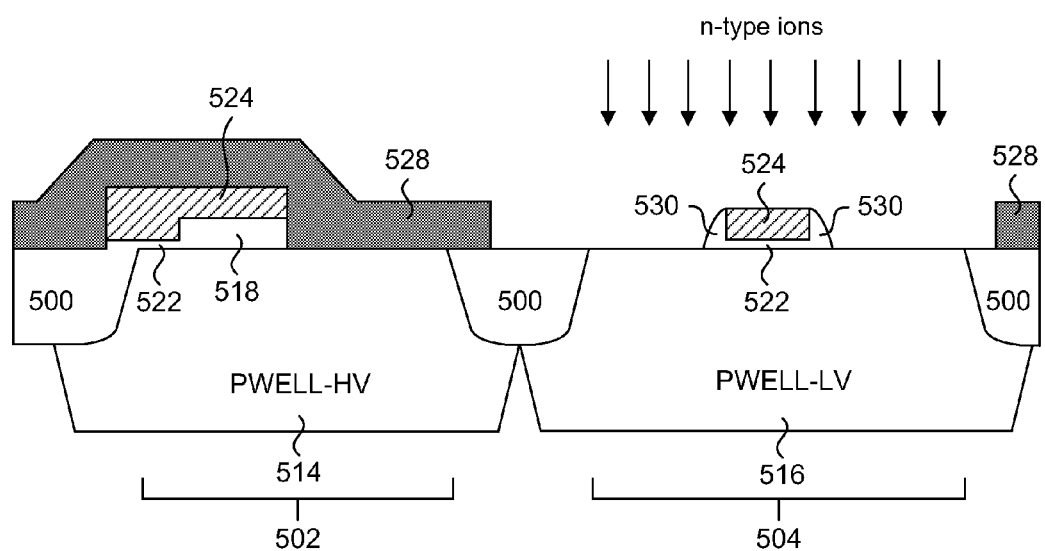

FIG. 10E shows two such stacks resulting from the gate polysilicon etch step, one being in the memory array area 502 and one being in the core circuit area 504. In memory array area 502, the stack consisting of gate polysilicon 524 over variable thickness oxides 518 and 522 is the anti-fuse transistor device. In core circuit area 504, the stack consisting of gate polysilicon 524 over thin oxide 522 is a low voltage transistor used in a logic circuit, for example. In FIG. 10E, a diffusion mask 528 is deposited over memory array area 502 and the I/O circuit area, thereby allowing for the formation of LDD regions (not shown) and sidewall spacers 530 adjacent to the gate polysilicon 524 of all the low voltage transistors in the core circuit area 504. After formation of the sidewall spacers 530, the exposed substrates are exposed to n-type diffusion implantation for forming source and drain diffusion regions for all the low voltage transistors in the core circuit area 504. The resulting LDD regions 532 and diffusion regions 534 for the low voltage transistors in the core circuit area 504 are shown in FIG. 10F, and have concentrations specifically designed for the low voltage transistors.

Figure 10F:
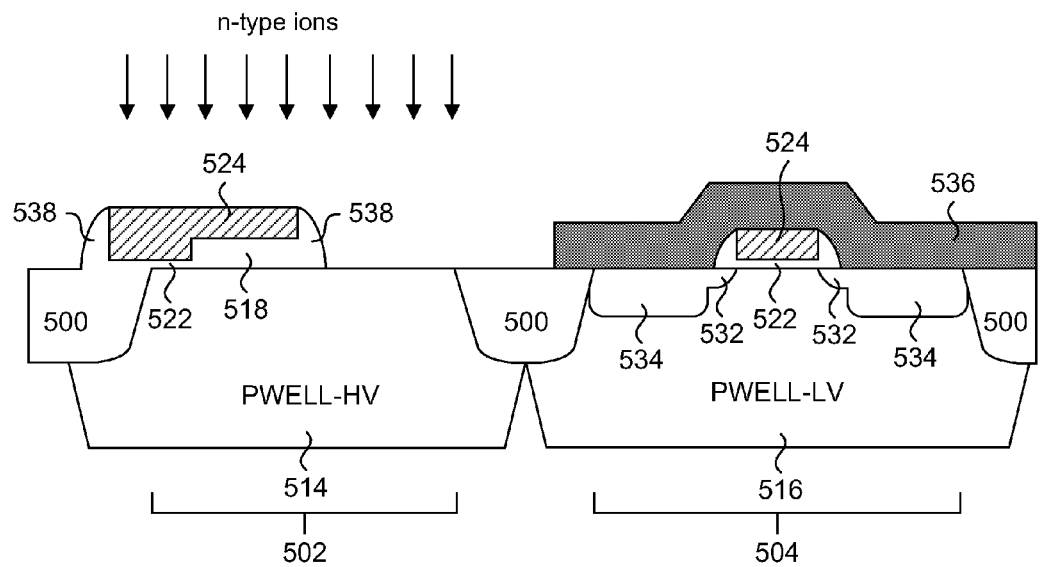
Figure 10G:
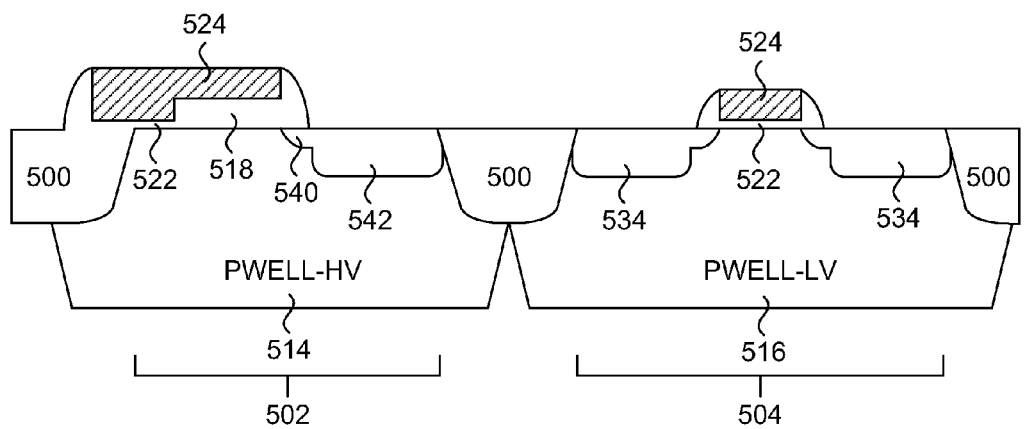

In FIG. 10F the diffusion mask 528 has been removed, and the low voltage transistors in the core circuit area 504 are covered with another diffusion mask 536. Now the transistors of the memory array area 502 are exposed to LDD implants, the formation of sidewall spacers 538, and diffusion region implantation. FIG. 10G shows the completed anti-fuse memory cell having LDD region 540 and diffusion region 542, and the completed low voltage transistor in the core circuit area 504. The resulting LDD region 540 and diffusion region 542 for the high voltage transistors in the memory array area 502 are shown in FIG. 10G, and have concentrations specifically designed for the high voltage transistors. At this point, all the transistors of the device are subjected to n-type implant diffusion annealing to activate the implanted dopants and to heal any implant damage. It is noted that the anti-fuse memory cell and low voltage transistor of FIG. 10F are the same as the corresponding ones shown in FIG. 7B. Fabrication of the anti-fuse memory cells and all other transistors is completed, and subsequent process steps would be executed for forming bitline contacts, and for depositing conductive tracks for interconnecting the transistor devices.

FIGS. 10A to 10G illustrate example steps in a CMOS fabrication process for forming a single transistor anti-fuse memory cell having a variable thickness gate oxide, and a low voltage core circuit transistor. The anti-fuse device of the single transistor anti-fuse memory cell and the low voltage core circuit transistor have thin gate oxides formed using the same gate oxide formation process, but have Vt implants and effective thresholds which differ. Because the entire high voltage p-well 514 is initially subjected to a common high voltage Vt implant, both the access transistor portion and the anti-fuse device portion of the single transistor anti-fuse memory cell have the same implant, but will have different effective Vt's. More specifically, the high voltage Vt implant is intended to ensure that the effective Vt of the access transistor portion having the thick gate oxide is at a specific value, such as 0.6V for example. Therefore the effective Vt of the anti-fuse device is less than 0.6V since its gate oxide is thinner. In an alternate embodiment, the area under the thin oxide 522 of the variable thickness gate oxide can be inhibited from receiving the high voltage Vt implant, thereby further reducing its effective Vt. The low voltage core circuit transistor is subjected to a low voltage Vt implant, which is intended to ensure that its effective Vt is at a specific value, such as 0.6V for example. In any case, the resulting effective Vt of the anti-fuse device will always be different than that of any low voltage core circuit transistor.

Figure 11:
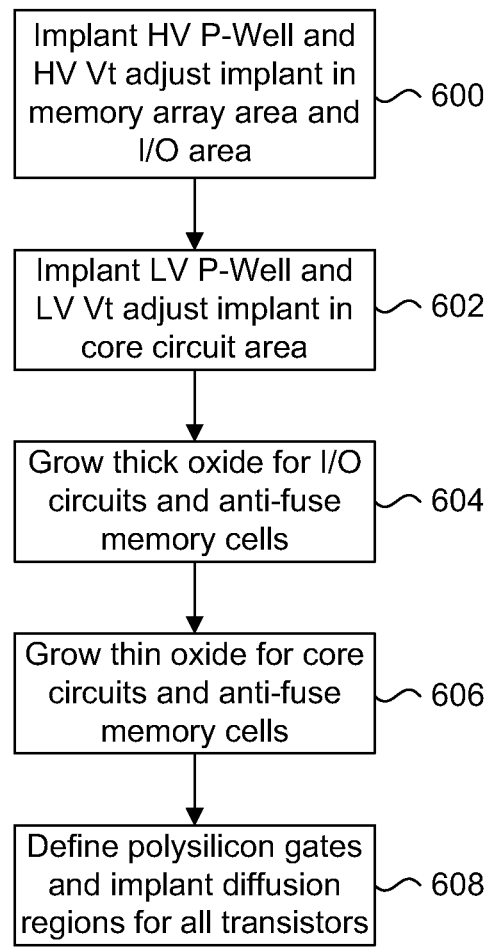
FIG. 11 is a flow chart summarizing the fabrication process for forming the anti-fuse memory cells of FIGS. 6B and 7B.

The fabrication process for forming the anti-fuse memory cells of FIGS. 6B and 7B is summarized in the flow chart of FIG. 11. Wells for the anti-fuse memory cells in the memory array area and the transistors in the I/O circuit area are formed in step 600, which corresponds to the fabrication steps shown in FIGS. 9A and 10A. A Vt adjust implant is introduced into these wells after well ion implantation, where the Vt adjust implant is designed for high voltage transistors. In the present example, the wells are designed for high voltage transistors. In an alternate embodiment, channel regions under thin oxide can be masked so that they do not receive any Vt adjust implant. At step 602, wells for the core circuit area are implanted, followed by a Vt adjust implant, which corresponds to the fabrication steps shown in FIGS. 9B and 10B. Thick gate oxide is grown for the I/O transistors and the access transistors of the anti-fuse memory cells in the memory array area at step 604, which corresponds to the fabrication steps shown in FIGS. 9C and 10C. Then thin gate oxide is grown for the anti-fuse transistor/devices in the memory array area and the core circuit transistors at step 606, which corresponds to the fabrication steps shown in FIGS. 9D and 10D. Step 606 can include thermally growing the thin oxide or deposition of the thin oxide. In either case, the thick gate oxide grown in step 604 is increased in thickness as the formed thin gate oxide is added to the thick gate oxide. Finally at step 608, the polysilicon gates for all the transistors are formed and the diffusion regions for the I/O transistors, anti-fuse memory cell transistors and the core circuit transistors are implanted. This corresponds to the fabrication steps shown in FIGS. 9D-9F and 10D-10F.

Figure 12:
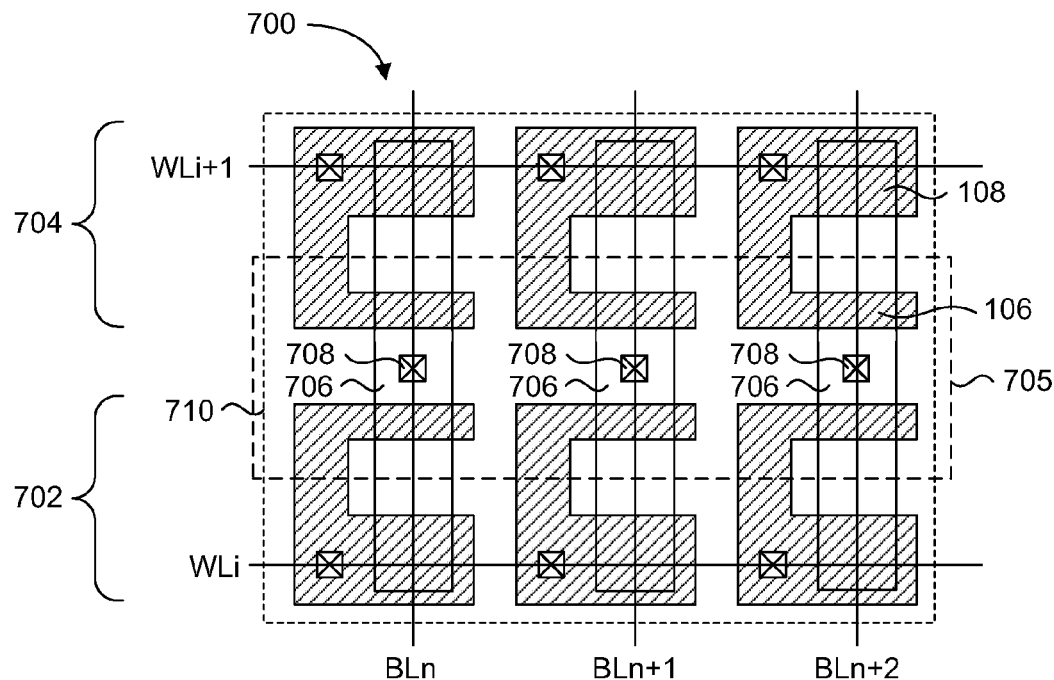
FIG. 12 is a plan view of a two-transistor anti-fuse memory array, according to an embodiment of the present invention.
Figure 13:
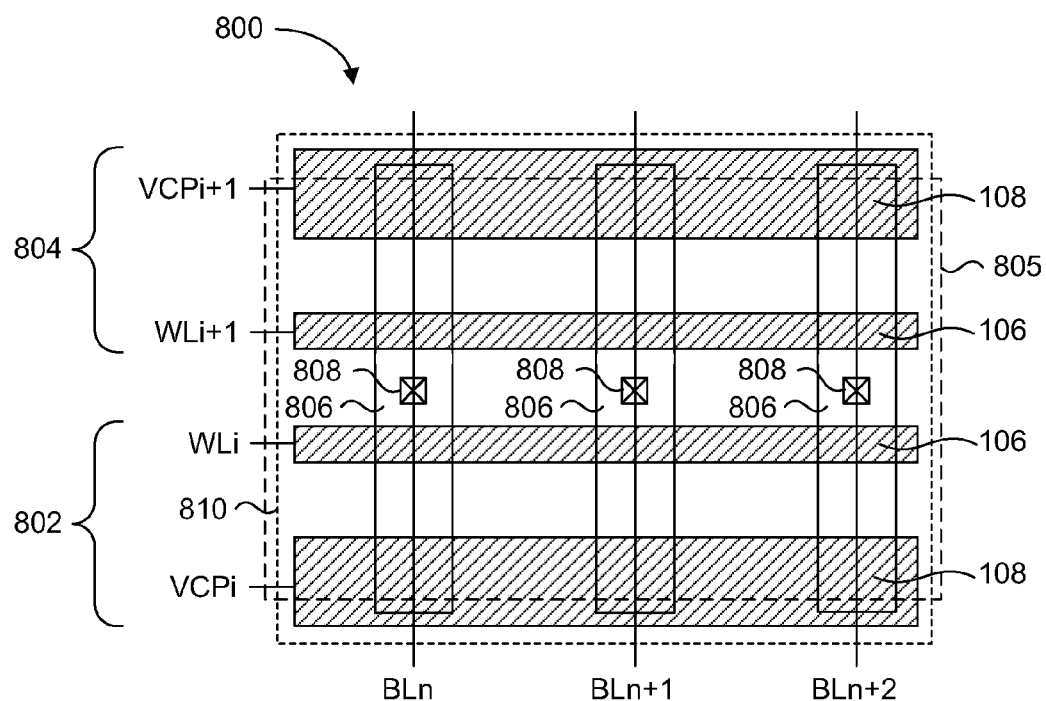
FIG. 13 is a plan view of an alternate two-transistor anti-fuse memory array, according to an embodiment of the present invention; and, FIG. 14 is a plan view of a single-transistor anti-fuse memory array, according to an embodiment of the present invention.
Figure 14:
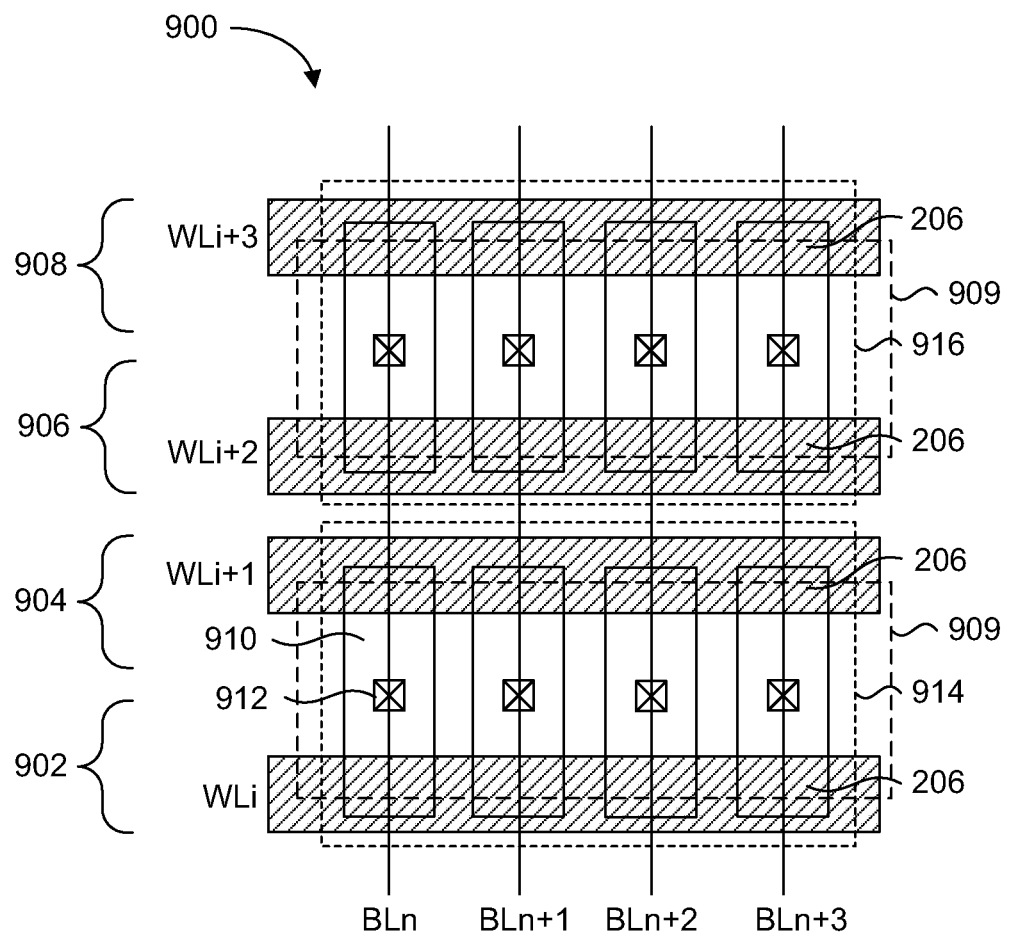

The previous Figures show one anti-fuse memory cell in isolation from other anti-fuse memory cells in a memory array. FIGS. 12 to 14 are plan view layout illustrations of multiple anti-fuse memory cells of the present embodiments arranged in a memory array.

FIG. 12 is a plan view layout of a two-transistor anti-fuse memory cell memory array according to an embodiment of the present invention. Each two-transistor anti-fuse memory cell in memory array 700 has both polysilicon gates 106 and 108 connected to each other, and have the same structure as anti-fuse memory cell 100 of FIGS. 6A and 6B. In order to maintain clarity of the drawing, only polysilicon gates 106 and 108 of one anti-fuse memory cell are annotated. Memory array 700 is shown to include six anti-fuse memory cells, where three are arranged in a first row 702 and another three are arranged in a second row 704. A first wordline WLi is connected to the anti-fuse memory cells of row 702, while a second wordline WLi+1 is connected to the anti-fuse memory cells of row 704. The dashed outline 705 defines the areas in the memory array in which a thick gate oxide is to be formed via a thick gate oxide definition mask during the fabrication process. In the configuration shown in FIG. 12, each pair of memory cells from rows 702 and 704 share a common diffusion region 706 and a common bitline contact 708. Each bitline contact is connected to a different bitline, such as bitlines BLn, BLn+1 and BLn+2. All the anti-fuse memory cells are formed in well 710, which according to the present embodiment is a high voltage p-type well. The anti-fuse memory cells of memory array 700 can be formed using the fabrication steps shown in FIGS. 9A-9G.

FIG. 13 is a plan view layout of a two-transistor anti-fuse memory cell memory array according to an embodiment of the present invention. Each two-transistor anti-fuse memory cell in memory array 800 has individually controlled polysilicon gates 106 and 108, and have the same structure as anti-fuse memory cell 100 of FIGS. 6A and 6B. In memory array 800, the polysilicon line forming polysilicon gates 106 and 108 of each anti-fuse memory cell are common to all the anti-fuse memory cells of the row. Memory array 800 is shown to include six anti-fuse memory cells, where three are arranged in a first row 802 and another three are arranged in a second row 804. A first wordline WLi is connected to the polysilicon gates 106 of row 802 while a first cell plate voltage VCPi is connected to the polysilicon gates 108 of row 802. A second wordline WLi+1 is connected to the polysilicon gates 106 of row 804 while a second cell plate voltage VCPi+1 is connected to the polysilicon gates 108 of row 804. The dashed outline 805 defines the areas in the memory array in which a thick gate oxide is to be formed via a thick gate oxide definition mask during the fabrication process. In the configuration shown in FIG. 13, each pair of memory cells from rows 802 and 804 share a common diffusion region 806 and a common bitline contact 808. Each bitline contact is connected to a different bitline, such as bitlines BLn, BLn+1 and BLn+2. All the anti-fuse memory cells are formed in well 810, which according to the present embodiment is a high voltage p-type well. The anti-fuse memory cells of memory array 800 can be formed using the fabrication steps shown in FIGS. 9A-9G.

FIG. 14 is a plan view layout of a single transistor anti-fuse memory cell memory array according to an embodiment of the present invention. Each single transistor anti-fuse memory cell in memory array 900 has one polysilicon gate 206, and have the same structure as anti-fuse memory cell 200 of FIGS. 7A and 7B. In memory array 900, the polysilicon line forming polysilicon gates 206 of each anti-fuse memory cell are common to all the anti-fuse memory cells of the row. Memory array 900 is shown to include sixteen anti-fuse memory cells, where four are arranged in each of first row 902, second row 904, third row 906 and fourth row 908. Wordlines WLi, WLi+1, WLi+2 and WLi+3 are connected to the polysilicon gates 206 of rows 902, 904, 906 and 908 respectively. The dashed outlines 909 define the areas in the memory array in which a thick gate oxide is to be formed via a thick gate oxide definition mask during the fabrication process. In the configuration shown in FIG. 14, each pair of memory cells from rows 902 and 904 share a common diffusion region 910 and a common bitline contact 912. Each bitline contact is connected to a different bitline, such as bitlines BLn, BLn+1, BLn+2 and BLn+3. The anti-fuse memory cells of rows 902 and 904 are formed in a first well 914, while the anti-fuse memory cells of rows 906 and 908 are formed in a second well 916. Both wells 914 and 916 can be identical high voltage p-type wells, but separated from each other via STI oxide formed in the substrate between WLi+1 and WLi+2. The anti-fuse memory cells of memory array 900 can be formed using the fabrication steps shown in FIGS. 10A-10G.

The previously described embodiments can be applied to mask ROM anti-fuse devices, such as the ones disclosed in commonly owned PCT Patent Publication No. WO2008/077240 filed on Dec. 20, 2007. WO2008/077240 teaches that an anti-fuse memory cell can be programmed by fabricating an electrical connection between its diffusion region or channel to a voltage supply.

The embodiments of the present invention illustrate two-transistor and single transistor memory cells having anti-fuse devices with threshold voltages that differ from low voltage core circuit transistors. This is achieved by forming the anti-fuse memory cells in a well used for high voltage transistors such as I/O transistors, while the core circuit transistors are formed in a well typically used for low voltage transistors. Since a single Vt adjustment implant and a single LDD implant are applied for both thick gate oxide transistors and thin gate oxide transistors in the memory array area, regions of potentially uncontrolled implant concentrations and implant damages are eliminated. In contrast, anti-fuse transistors using two different wells suffer from the aforementioned disadvantages due to mask misalignment causing two or more implant regions to overlap each other. Accordingly, a higher quality thin gate oxide for the anti-fuse transistor, or anti-fuse device, results in lowered effective threshold and resistance, thereby providing good breakdown characteristics.

In summary, the thin and thick gate oxide or dielectric regions of the anti-fuse memory cell are formed in the same well, or in the wells of the same type and doping profile. The core circuit transistors, I/O transistors, or both, use a different well doping profile than the wells of the memory array area. The thin and thick gate oxide regions of the anti-fuse memory cell can receive the same Vt adjust, or control ion implantation, but the thin gate oxide region and the core circuit region receive different Vt control ion implantation. The effective Vt of the anti-fuse device will be lower than at least one core circuit transistor of the same type and having the same gate oxide thickness.

The previously presented example embodiments show anti-fuse memory cells formed in high voltage p-wells while core circuit transistors are formed in low voltage p-wells. Alternately, the anti-fuse memory cells can be formed in high voltage n-wells while core circuit transistors are formed in low voltage n-wells.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A memory device comprising:
a memory array including a plurality of anti-fuse memory cells, each of the plurality of anti-fuse memory cells including
an access transistor having a thick gate oxide formed in a high voltage well having a high voltage well profile, the high voltage well being one of n-type and p-type, and
an anti-fuse device having a thin gate oxide formed in the high voltage well, the thin gate oxide having a thickness less than the thick gate oxide; and,
a core transistor having a gate oxide corresponding in thickness to the thin gate oxide, the core transistor being formed in a low voltage well having a same type as the high voltage well, the low voltage well having a low voltage well profile different from the high voltage well profile, and the low voltage well having a concentration greater than the high voltage well.

2. The memory device of claim 1, further including input/output transistors formed in another well being substantially identical in type and doping profile to the high voltage well.

3. The memory device of claim 1, wherein the anti-fuse device has a lower threshold voltage than the core transistor.

4. The memory device of claim 1, wherein the thick gate oxide includes an intermediate oxide and the thin gate oxide deposited over the intermediate oxide.

5. The memory device of claim 1, wherein the thin gate oxide is thermally grown on a substrate surface of the first well.

6. The memory device of claim 5, wherein the thick gate oxide includes an intermediate oxide and thermally grown oxide between the intermediate oxide and the substrate surface.

7. The memory device of claim 1, wherein the access transistor includes a first diffusion region electrically connected to a bitline and a second diffusion region electrically connected to the anti-fuse device.

8. The memory device of claim 7, wherein the access transistor has a threshold voltage greater than the core transistor and the anti-fuse device.

9. The memory device of claim 8, wherein the anti-fuse device has a variable thickness gate oxide having a thin portion corresponding to the thin gate oxide and a thick portion corresponding to the thick gate oxide, the variable thickness gate oxide being formed underneath a single polysilicon gate.

10. The memory device of claim 9, wherein channel regions under the thick portion of the variable thickness gate oxide and the access transistor thick gate oxide have substantially the same Vt implant.

11. The memory device of claim 1, wherein the access transistor thick gate oxide corresponds to a thick portion of a variable thickness gate oxide and the anti-fuse device thin gate oxide corresponds to a thin portion of the variable thickness gate oxide, the variable thickness gate oxide being formed underneath a single polysilicon gate.

12. The memory device of claim 11, wherein the anti-fuse transistor has a threshold voltage that is less than the access transistor and the core transistor.

13. A method for fabricating a memory device comprising:
implanting first wells in a memory array circuit area, the first wells being one of n-type and p-type;
implanting second wells in a core circuit area, the second wells being a same type as the first wells and the second wells have a concentration greater than the first wells;
forming a first oxide for access transistors in the first wells of the memory array circuit area; and,
simultaneously forming a second oxide for core transistors in the second wells of the core circuit area and for anti-fuse devices in the first wells of the memory array circuit area.

14. The method of claim 13, wherein the first wells are high voltage wells and the second wells are low voltage wells.

15. The method of claim 13, wherein the step of simultaneously forming includes increasing a thickness of the first oxide as the second oxide is being formed, the second oxide corresponding to a thin gate oxide of the anti-fuse devices.

16. The method of claim 15, wherein increasing includes depositing the second oxide on a substrate surface and on the first oxide at the same time, the combination of the first oxide and the second oxide forming a thick gate oxide of the access transistors.

17. The method of claim 15, wherein increasing includes thermally growing the second oxide on a substrate surface and underneath the first oxide at the same time, the combination of the first oxide and the second oxide forming a thick gate oxide of the access transistors.

18. The method of claim 13, further including exposing the first wells to a high threshold voltage adjust implant for adjusting a threshold voltage of the access transistors and the anti-fuse devices.

19. The method of claim 13, further including exposing the first wells to a high threshold voltage adjust implant for adjusting a threshold voltage of the access transistors and the anti-fuse devices while masking channel regions corresponding to the anti-fuse device for inhibiting implantation of the high threshold voltage adjust implant.

20. The method of claim 13, further including exposing the second wells to a low threshold voltage adjust implant for adjusting a threshold voltage of the core transistors, while inhibiting exposure of the antifuse transistors to the low threshold voltage adjust implant.

21. The method of claim 16, wherein the step of implanting the first wells includes simultaneously implanting the first wells in an input/output circuit area.

22. The method of claim 21, wherein the step of forming a first oxide includes simultaneously forming the first oxide of input/output transistors in the first wells of the input/output circuit area.

23. The method of claim 22, wherein the step of increasing includes depositing the second oxide on the first oxide of the input/output transistors, the combination of the first oxide and the second oxide forming a thick gate oxide of the input/output transistors.

24. The method of claim 22, wherein the step of exposing includes exposing the first wells to a high threshold voltage adjust implant for adjusting a threshold voltage of the access transistors, the anti-fuse devices and the input/output transistors.

25. The method of claim 24, further including exposing the second wells to a low threshold voltage adjust implant for adjusting a threshold voltage of the core transistors.

26. A memory device comprising:
anti-fuse memory cells in first wells of a memory array circuit area, the first wells being one of n-type and p-type and having a first well profile;
input/output transistors in the first wells of an input/output area of the memory device; and,
core transistors in second wells in a core circuit area, the second wells being a same type as the first wells, and having a second well profile different than the first well profile, the second wells having a concentration greater than the first wells.

27. The memory device of claim 26, wherein each of the anti-fuse memory cells includes an access transistor and an anti-fuse device.

28. The memory device of claim 27, wherein the access transistor and the input/output transistors have gate oxides with a first thickness.

29. The memory device of claim 28, wherein the anti-fuse device and the core transistors have gate oxides with a second thickness smaller than the first thickness.

30. The memory device of claim 29, wherein the access transistor and the input/output transistors have a first threshold voltage, the anti-fuse device has a second threshold voltage less than the first threshold voltage, and the core transistors have a third threshold voltage less than the first threshold voltage and different from the second threshold voltage.

* * * * *